US011759909B2

(12) United States Patent
Ahn et al.

(10) Patent No.: US 11,759,909 B2
(45) Date of Patent: Sep. 19, 2023

(54) POLISHING PAD, PREPARATION METHOD THEREOF AND METHOD FOR PREPARING SEMICONDUCTOR DEVICE USING SAME

(71) Applicant: SK enpulse Co., Ltd., Gyeonggi-do (KR)

(72) Inventors: Jae In Ahn, Gyeonggi-do (KR); Kyung Hwan Kim, Gyeonggi-do (KR); Sung Hoon Yun, Gyeonggi-do (KR); Jang Won Seo, Gyeonggi-do (KR); Kang Sik Myung, Gyeonggi-do (KR)

(73) Assignee: SK ENPULSE CO., LTD., Gyeonggi-do (KR)

( * ) Notice: Subject to any disclaimer, the term of this patent is extended or adjusted under 35 U.S.C. 154(b) by 328 days.

(21) Appl. No.: 17/349,367

(22) Filed: Jun. 16, 2021

(65) Prior Publication Data

US 2021/0394335 A1    Dec. 23, 2021

(30) Foreign Application Priority Data

Jun. 19, 2020   (KR) .................. 10-2020-0075100
Jun. 19, 2020   (KR) .................. 10-2020-0075103

(51) Int. Cl.
*B24B 37/24*    (2012.01)
*B24D 18/00*    (2006.01)
*H01L 21/3105*  (2006.01)
*C09G 1/02*     (2006.01)

(52) U.S. Cl.
CPC .......... *B24B 37/24* (2013.01); *B24D 18/0009* (2013.01); *C09G 1/02* (2013.01); *H01L 21/31053* (2013.01)

(58) Field of Classification Search
CPC ...................................................... C09G 1/02
See application file for complete search history.

(56) References Cited

U.S. PATENT DOCUMENTS

| 2002/0016145 A1 | 2/2002 | Tominaga et al. |
| 2009/0075568 A1 | 3/2009 | Kimura et al. |
| 2013/0331014 A1 | 12/2013 | Shiro et al. |
| 2019/0314954 A1 | 10/2019 | Heo et al. |

FOREIGN PATENT DOCUMENTS

| CN | 101175603 B | 12/2014 |
| CN | 108247528 A | 7/2018 |
| CN | 109311138 A | 2/2019 |
| EP | 2669046 A1 | 12/2013 |

(Continued)

OTHER PUBLICATIONS

Machine Translation of KR-10-2004-0066811 (Year: 2023).*

(Continued)

*Primary Examiner* — Alexandra M Moore
(74) *Attorney, Agent, or Firm* — IP & T GROUP LLP

(57) ABSTRACT

The embodiments relate to a polishing pad for use in a chemical mechanical planarization (CMP) process of semiconductors, to a process for preparing the same, and to a process for preparing a semiconductor device using the same. The polishing pad according to the embodiment adjusts the surface roughness characteristics of the polishing pad after polishing, whereby the polishing rate can be enhanced, and the surface residues, surface scratches, and chatter marks of the wafer can be remarkably reduced.

20 Claims, 5 Drawing Sheets

(56) References Cited

FOREIGN PATENT DOCUMENTS

| JP | 2020-049621 A |   | 4/2020 |
|----|---------------|---|--------|
| KR | 20040066811 A | * | 1/2004 |
| KR | 10-2008-0037719 A | | 4/2008 |
| KR | 10-2015-0038331 A | | 4/2015 |
| KR | 10-1949905 B1 | | 2/2019 |
| KR | 10-2019-0100446 A | | 8/2019 |
| TW | I307299 B | | 3/2009 |
| TW | 201943774 A | | 11/2019 |
| WO | 2007/011158 A1 | | 1/2007 |
| WO | 2012/117789 A1 | | 9/2012 |

OTHER PUBLICATIONS

Office Action issued by the Korean Patent Office dated Oct. 28, 2020.

Office Action issued by the Taiwanese Patent Office dated Mar. 9, 2022.

\* cited by examiner

[Fig. 1]
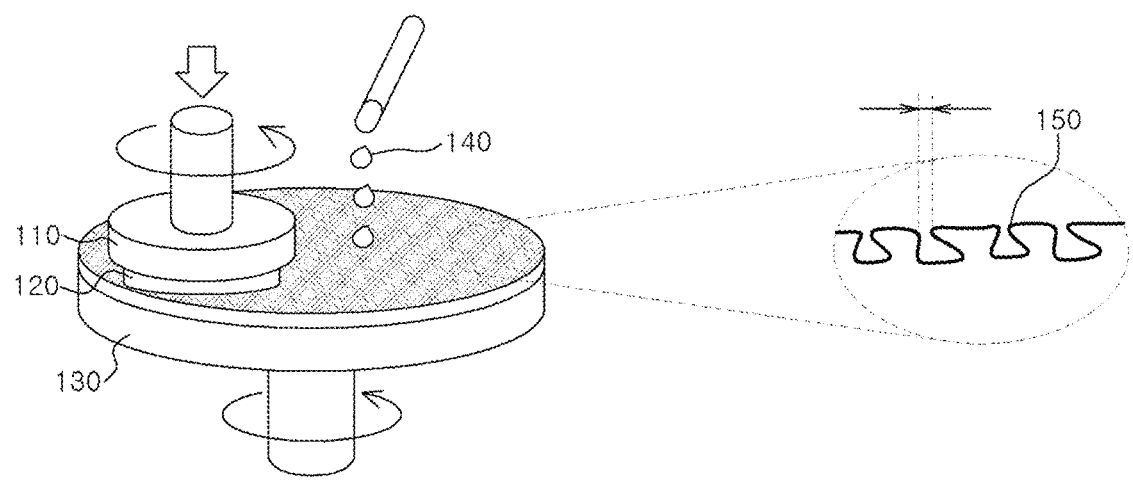
[Fig. 2]
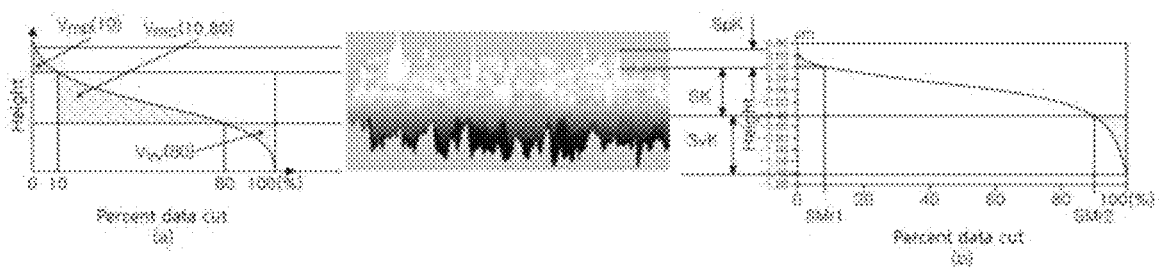

[Fig. 3]
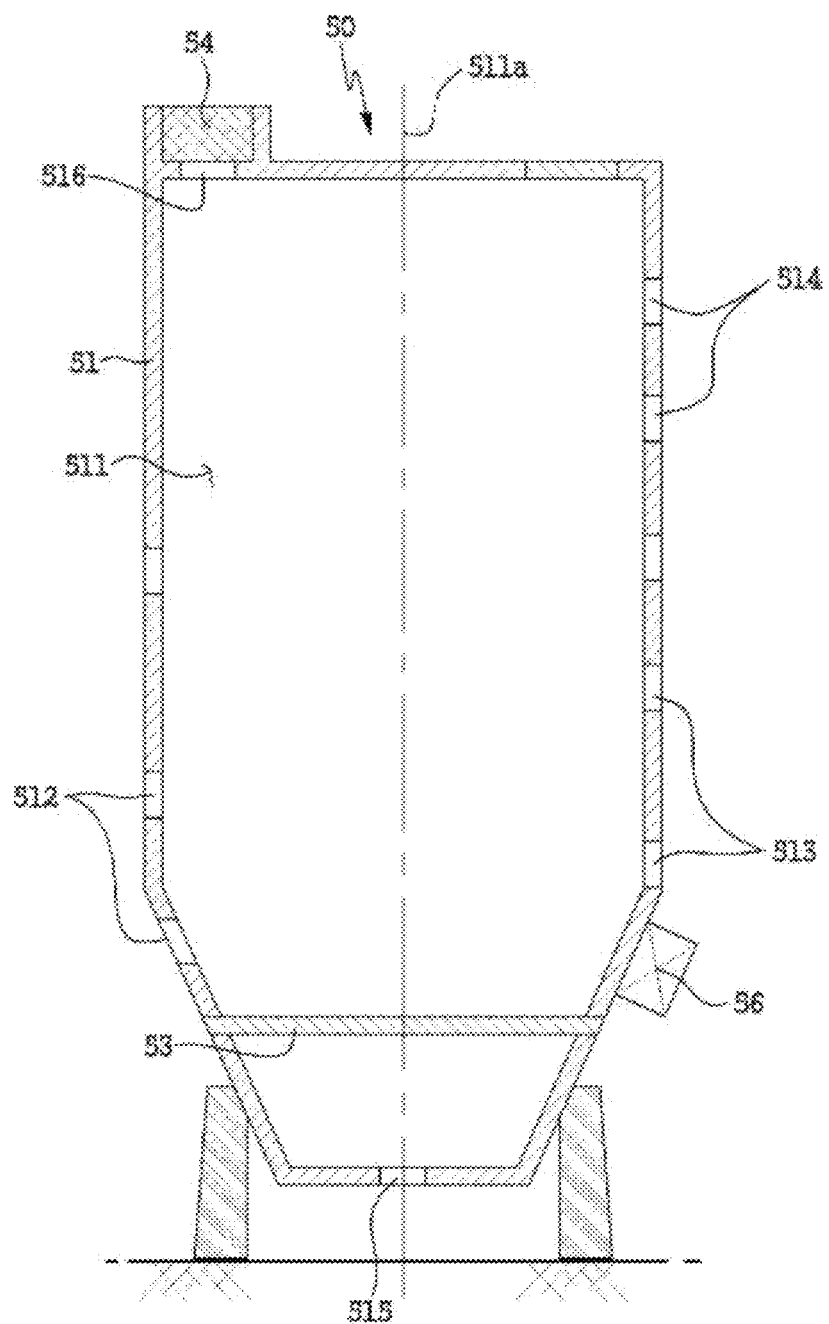

[Fig. 4]
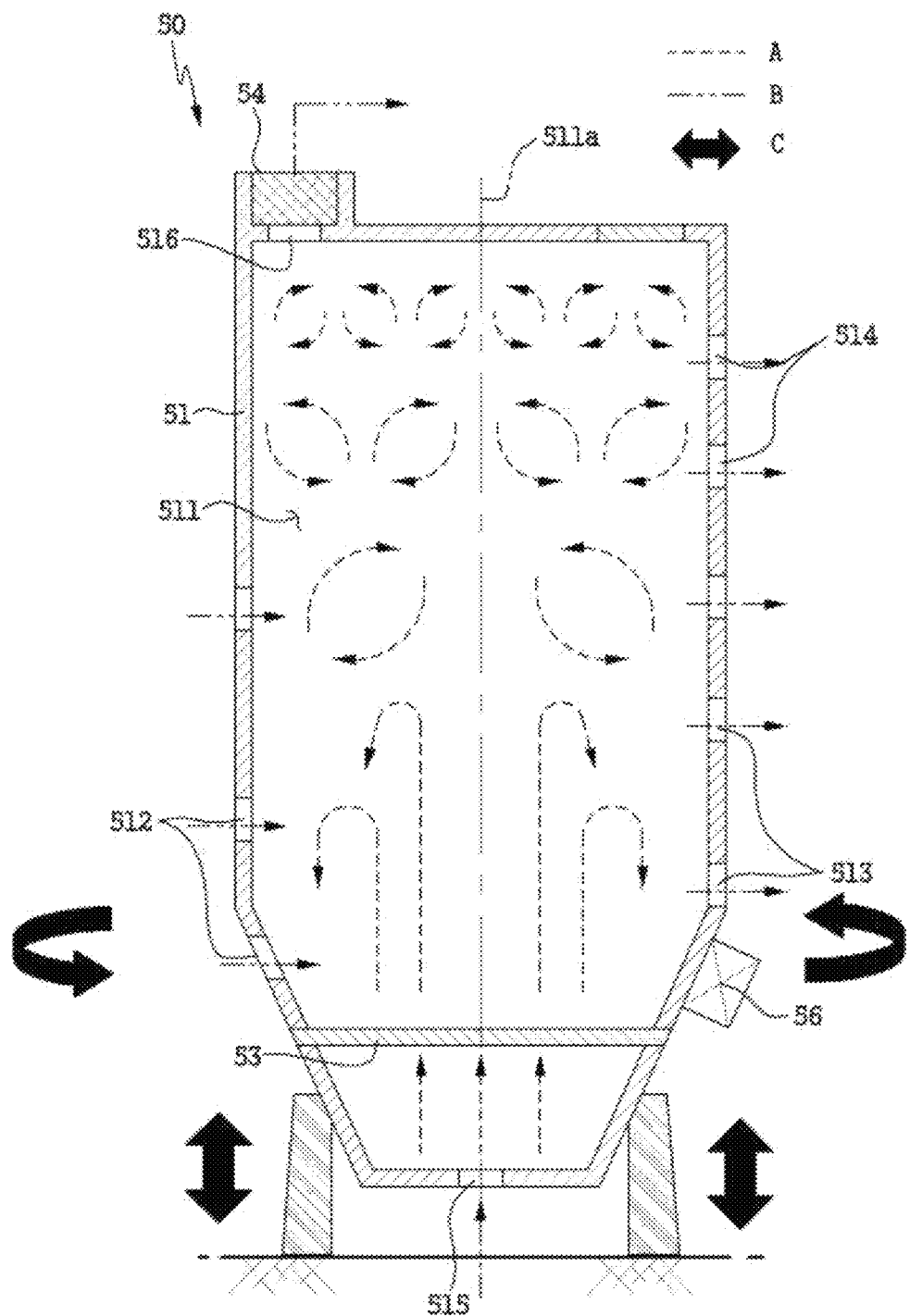

[Fig. 5]
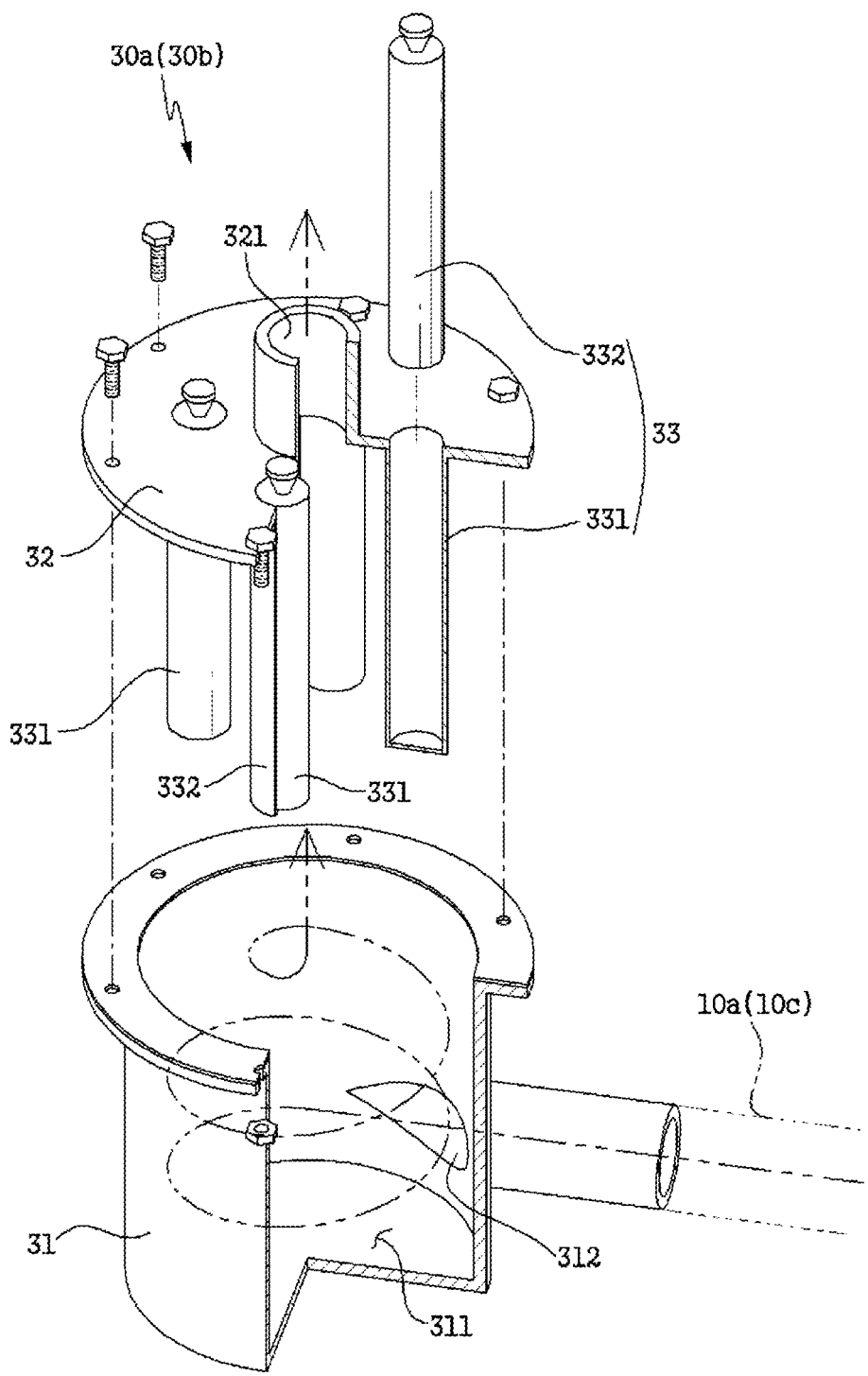

[Fig. 6]
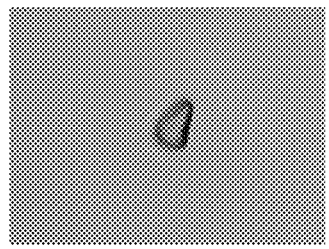
[Fig. 7]
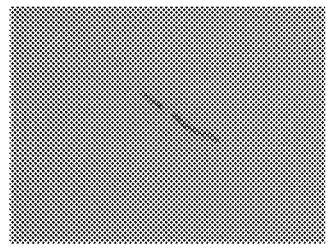
[Fig. 8]
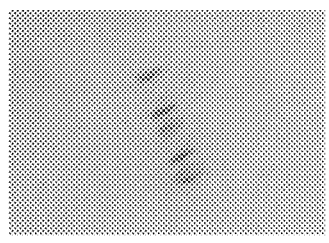

US 11,759,909 B2

POLISHING PAD, PREPARATION METHOD THEREOF AND METHOD FOR PREPARING SEMICONDUCTOR DEVICE USING SAME

The present application claims priority of Korean patent application number 10-2020-0075100 and 10-2020-0075103 filed on Jun. 19, 2020. The disclosure of each of the foregoing applications is incorporated herein by reference in its entirety.

TECHNICAL FIELD

Embodiments relates to a polishing pad whose surface roughness characteristics after polishing are adjusted, to a process for preparing the same, and to a process for preparing a semiconductor device using the same.

BACKGROUND ART

The chemical mechanical planarization (CMP) process in a process for preparing semiconductors refers to a step in which a semiconductor substrate such as a wafer is fixed to a head and in contact with the surface of a polishing pad mounted on a platen, and the wafer is then chemically treated by supplying a slurry while the platen and the head are relatively moved, to thereby mechanically planarize the irregularities on the semiconductor substrate.

A polishing pad is an essential member that plays an important role in such a CMP process. In general, a polishing pad is composed of a polyurethane-based resin and has grooves on its surface for a large flow of a slurry and pores for supporting a fine flow thereof. The pores in a polishing pad among the above may be formed by using a solid phase foaming agent having voids, a gas phase foaming agent, or a liquid phase foaming agent, or by generating a gas by a chemical reaction.

However, the method of using a gas phase or liquid phase foaming agent to form micropores has the advantage that no material that may affect the CMP process is discharged, whereas there may be a problem in that it is difficult to precisely control the size, size distribution, and number of pores. In addition, since the micropores each do not have a separate outer wall, there is a disadvantage in that it is difficult to maintain the shape of the micropores during the CMP process.

On the other hand, the method of preparing a polishing pad using a solid phase foaming agent having an outer wall and a void has the advantage that the shape, size distribution, and number of pores can be precisely controlled unlike the method of using a gas phase or liquid phase foaming agent. It is advantageous that the shape of micropores can be maintained during the CMP process by virtue of the presence of the outer wall of the solid phase foaming agent.

However, in the method of using a solid phase foaming agent, there is a problem in that it is difficult to freely control the shape of the solid phase foaming agent and that a solid phase foaming agent may partially coalesce in the polishing pad during the process in which the solid phase foaming agent is mixed to a polymer.

The shape of micropores and the pore coalescence phenomenon that partially takes place in a polishing pad may have an impact on the polishing rate, wafer planarization, and residues, scratches, and chatter marks on the wafer surface among the significant performance of a CMP process. Thus, their control is particularly important.

PRIOR ART DOCUMENT

Patent Document (Patent Document 1) Korean Laid-open Patent Publication No. 2008-0037719

DISCLOSURE OF INVENTION

Technical Problem

The present invention aims to solve the above problems of the prior art.

The technical problem to be solved by the present invention is to provide a polishing pad and a process for preparing the same, in which the shape and coalescence phenomenon of micropores are controlled, thereby adjusting the surface roughness characteristics of the polishing pad after polishing to a certain level; consequently, it is possible to improve the residues, scratches, and chatter marks on the wafer surface and to further enhance the polishing rate.

In addition, it is aimed to provide a process for preparing a semiconductor device using the polishing pad.

Solution to Problem

An embodiment to achieve the above object provides a polishing pad, which satisfies the following Relationships 5 and 6 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$Spk/Svk<1.2 \quad \text{[Relationship 5]}$$

$$0.1 \leq Spk/Sk \leq 1.1 \quad \text{[Relationship 6]}$$

In Relationships 1 and 2,
Spk is the reduced peak height,
Svk is the reduced valley depth, and
Sk is the core roughness depth.

Another embodiment provides a process for preparing a polishing pad, which comprises mixing a urethane-based prepolymer, a curing agent, and a foaming agent to prepare a raw material mixture; and injecting the raw material mixture into a mold and curing it to form a polishing layer, wherein the polishing pad satisfies the above Relationships 5 and 6 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

Still another embodiment provides a process for preparing a semiconductor device, which comprises mounting a polishing pad comprising a polishing layer on a platen; and relatively rotating the polishing surface of the polishing layer and the surface of a wafer while they are in contact with each other to polish the surface of the wafer, wherein the polishing pad satisfies the above Relationships 5 and 6 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

Still another embodiment provides a polishing pad, which satisfies the following Relationship 11 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$0.5 \leq (Spk+Svk)/Sk \leq 3.5 \quad \text{[Relationship 11]}$$

In Relationship 11,
Spk is the reduced peak height,
Svk is the reduced valley depth, and
Sk is the core roughness depth.

Still another embodiment provides a process for preparing a polishing pad, which comprises mixing a urethane-based prepolymer, a curing agent, and a foaming agent to prepare a raw material mixture; and injecting the raw material mixture into a mold and curing it to form a polishing layer, wherein the polishing pad satisfies the above Relationship 11 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

Still another embodiment provides a process for preparing a semiconductor device, which comprises mounting a polishing pad comprising a polishing layer on a platen; and relatively rotating the polishing surface of the polishing layer and the surface of a wafer while they are in contact with each other to polish the surface of the wafer, wherein the polishing pad satisfies the above Relationship 11 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

Advantageous Effects of Invention

In the polishing pad according to the embodiment, the shape and coalescence phenomenon of micropores are controlled, thereby adjusting the surface roughness characteristics of the polishing pad after polishing to a certain level; consequently, it is possible to improve the residues, scratches, and chatter marks on the wafer surface and to further enhance the polishing rate.

BRIEF DESCRIPTION OF DRAWINGS

FIG. 1 illustrates an example of a polishing process capable of representing the deformation of the surface shape and pore shape of a polishing pad by shear stress according to an embodiment of the present invention.

FIG. 2 is a schematic diagram illustrating a volume parameter (a) and a height parameter (b) derived from an areal material ratio curve based on the ISO 25178-2 standard when a polishing pad is measured with an optical surface roughness meter.

FIG. 3 is a schematic diagram showing the classification unit in the classification and purification apparatus of a solid phase foaming agent according to an embodiment.

FIG. 4 is a diagram illustrating an operation state of the classification unit in the classification and purification apparatus of a solid phase foaming agent according to an embodiment.

FIG. 5 is an exploded perspective view of the filter unit (30a, 30b) in the classification and purification apparatus of a solid phase foaming agent according to an embodiment.

FIG. 6 is a photograph showing the shape of a residue on a wafer according to an embodiment.

FIG. 7 is a photograph showing the shape of a scratch on a wafer according to an embodiment.

FIG. 8 is a photograph showing the shape of a chatter mark on a wafer according to an embodiment.

[Reference Numeral of the Drawings]

| | |
|---|---|
| 110: head | 120: semiconductor substrate (or wafer) |
| 130: platen | 140: slurry |
| 150: pores | |
| 10a, 10c: pipe | 30a, 30b: filter unit |
| 31: filter housing | 32: filter cover |
| 33: filter member | 311: filter space |
| 312: filter inlet | 321: filter outlet |
| 331: mounting member | 332: magnet |
| 50: classification unit | 51: classification housing |
| 53: vortex generation member | 54: discharge filter |
| 56: vibration generation member | |
| 511: classification space | 511a: central axis |
| 512: classification inlet hole | 513: first microsphere discharge hole |
| 514: second microsphere discharge hole | |
| 515: gas supply hole | 516: gas discharge hole |
| A: flow of the fluidizing gas | |
| B: flow of the solid phase foaming agent | |
| C: vibration arrow | |

BEST MODE FOR CARRYING OUT THE INVENTION

In the description of the following embodiments, in the case where each layer or pad is mentioned to be formed "on" or "under" another layer or pad, it means not only that one element is "directly" formed on or under another element, but also that one element is "indirectly" formed on or under another element with other element(s) interposed between them.

In addition, the term on or under with respect to each element may be referenced to the drawings. For the sake of description, the sizes of individual elements in the appended drawings may be exaggeratingly depicted and do not indicate the actual sizes.

In addition, all numerical ranges related to the physical properties, dimensions, and the like of a component used herein are to be understood as being modified by the term "about," unless otherwise indicated.

[Polishing Pad]

The polishing pad according to an embodiment of the present invention satisfies the following Relationships 1 and 2 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$0.020 \leq Vmp(10)/Vvv(80) \leq 1.000 \quad \text{[Relationships 1]}$$

$$0.005 \leq Vmp(10)/Vmc(10,80) \leq 2.000 \quad \text{[Relationships 2]}$$

In Relationships 1 and 2,
Vmp(10) is the material volume of the peaks corresponding to the upper 10%,
Vvv(80) is the void volume of the valleys corresponding to the upper 80% to 100%, and
Vmc(10, 80) is the material volume of the core corresponding to the upper 10% to 80%.

The polishing pad according to another embodiment of the present invention satisfies the following Relationship 4 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$0.002 \leq Vmp(10)/Vv(0) \leq 0.100 \quad \text{[Relationship 4]}$$

In Relationship 4,
Vmp(10) is as defined above,
Vv(0) is the total void volume.

The polishing pad according to an embodiment of the present invention satisfies the following Relationships 5 and 6 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$Spk/Svk < 1.2 \quad \text{[Relationship 5]}$$

$$0.1 \leq Spk/Sk \leq 1.1 \quad \text{[Relationship 6]}$$

In Relationships 5 and 6,
Spk is the reduced peak height,
Svk is the reduced valley depth, and
Sk is the core roughness depth.

The polishing pad according to still another embodiment of the present invention satisfies the following Relationship 11 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$0.5 \leq (Spk+Svk)/Sk \leq 3.5 \quad \text{[Relationship 11]}$$

In Equation 1,
Spk, Svk, and Sk are as defined above.

According to an embodiment of the present invention, the surface roughness characteristics of the polishing pad after polishing, especially the ratio of the volume parameters and height parameters derived from the areal material ratio curve, are controlled within a specific range, whereby it is possible to improve the residues, scratches, and chatter marks on the wafer surface and to further enhance the polishing rate.

Surface Roughness of a Polishing Pad After Polishing

In the present specification, the surface roughness refers to a surface roughness of a polishing pad in which the surface of the polishing pad is formed by processing or polishing. The optical surface roughness meter used in the present invention is a Contour GT model manufactured by Bruker. For detailed conditions of measuring the surface roughness of a polishing pad, see the examples of the present specification.

When the surface roughness of a polishing pad is maintained to be constant during the polishing process or after polishing, the polishing rate, surface residues, surface scratches, and chatter marks of a wafer may be maintained to be constant. In addition, as the polishing process is carried out, the surface roughness of the polishing pad varies since damage and deformation are applied to the surface of the polishing pad, depending on (1) the surface cutting by a conditioner, (2) the pressure and shear stress applied from the carrier member (including the wafer), and (3) the shape of the slurry present at the interface between the wafer and the polishing pad.

As an example, referring to FIG. 1, the polishing pad is used in a chemical mechanical planarization (CMP) process, in which the surface shape of the polishing pad is deformed by the pressure applied in the vertical direction through the semiconductor substrate (or wafer) (120) attached to the head (110) and by the shear stress applied in the horizontal direction by the rotation of the platen (130) during the process.

The polishing pad is provided on its surface with grooves for a large flow of a slurry (140) and pores for supporting a fine flow thereof. In the polishing pad, not only the grooves on the surface but also the shape of pores (150) are deformed by external stress, which may cause a change in the surface roughness of the polishing pad.

In particular, a change in the shape of micropores and the degree of pore coalescence that causes a change in the surface roughness of the polishing pad may have an impact on the polishing rate, the planarization of a wafer substrate, and the residues, scratches, and chatter marks on the wafer surface among the significant performance of a CMP process. Thus, their control is particularly important.

The surface roughness of the polishing pad after polishing adjusted by these characteristics may vary depending on the type of a urethane-based prepolymer. In addition, the surface roughness may vary depending on the type of a foaming agent (a gas phase foaming agent, a liquid phase foaming agent, or a solid phase foaming agent). In addition, the surface roughness may vary depending on whether or not a purification system of a solid foaming agent is used. In addition, the surface roughness may vary depending on whether or not the respective components are purified. In addition, the surface roughness may vary depending on the rotational speed of the mixing head when the respective components are mixed, the degree of grooving, and preconditioning conditions. In addition, the surface roughness may be controlled by various variables.

In the polishing pad according to an embodiment of the present invention, the surface roughness may be one measured after polishing, that is, after 25 dummy wafers are polished for 60 seconds each and two monitoring wafers are polished for 60 seconds each, each of the wafers being a silicon oxide wafer (or PETEOS wafer), while a ceria silica slurry is sprayed at a rate of 200 cc/min on to the polishing pad.

Here, the dummy wafer is a wafer mainly used for experiments and tests. It is used to control the surface characteristics of a non-uniform polishing pad into a uniform shape by compressing the surface of the polishing pad at the beginning of the use of the polishing pad, that is, before polishing is actually carried out. The monitoring wafer is a wafer used for the purpose of substantially monitoring the physical properties of a polishing pad after polishing.

The polishing pad may be used to carry out a CMP process using the AP-300 model of CTS. In order to optimize the surface condition of the pad, a pre-break-in process may be carried out for 10 to 20 minutes before polishing, specifically before a dummy wafer is polished, to condition the polishing layer of the polishing pad. For specific conditions for the polishing process of the polishing pad, see the examples to be described later.

The areal material ratio curve obtained using a surface roughness meter after the polishing process is carried out as described above is called a bearing area curve (BAC) or an Abbott-Firestone curve. It is a graph in which cumulative data measured for a unit area with respect to height through the surface roughness meter are plotted.

The parameters derived from the areal material ratio curve of the surface roughness are an S parameter (hereinafter referred to as a height parameter) converted to height and a V parameter (hereinafter referred to as a volume parameter) converted to volume. In the present invention, Spk, Svk, and Sk as the S parameter, and Vmp(10), Vmc(10,80), Vvv(80), and Vv(0) as the V parameter, are controlled according to the embodiment to improve the polishing performance.

In this connection, FIG. 2 is a schematic diagram illustrating the volume parameters (a) and the height parameters (b) derived from an areal material ratio curve when a polishing pad is measured with an optical surface roughness meter.

Hereinafter, referring to FIGS. 2(a) and 2(b), the volume parameters and the height parameters of surface roughness will be described in detail.

<Volume Parameters of Surface Roughness>

The volume parameters of surface roughness include material volume parameters (Vmp(10), Vmc(10,80)) and void volume parameters (Vvv(80), Vv(0)).

The material volume parameters are parameters related to the volume occupied by the actual material in the evaluation area. They are parameters related to the volume of a polishing pad in which the wafer and the polishing pad are directly rubbed by the pressure applied to the carrier member in the polishing apparatus during the polishing process.

In the material volume parameters, referring to FIG. 2(a), Vmp(10) is the material volume of the peaks corresponding to the upper 10%. It is the volume of the material composed of surfaces from the height (y-axis) corresponding to 10% among 0% to 100% (x-axis) of the percent data cut in the graph to the highest peak. Since Vmp(10) is a parameter that accounts for the material volume to be initially worn by the material to be polished, it may be a parameter most relevant to mechanical polishing in the CMP process.

Vmc(10,80) is the material volume of the core corresponding to the upper 10% to 80%. It is the material volume that makes up the surface texture between the heights (y-axis) corresponding to 10% and 80% among 0% to 100% (x-axis) of the percent data cut.

Meanwhile, the void volume parameters are parameters related to the void occupied by the empty space in the evaluation area. They are parameters related to pores that act as microchannels through which a slurry and by-products that may cause defects/scratches are allowed to move freely at the interface between the wafer and the polishing pad during the polishing process. The slurry that moves through these pores causes a chemical reaction with the layer to be polished of the wafer through contact with the wafer, thereby enabling chemical polishing.

In addition, if the crushed materials of the polishing pad, the polishing debris of the layer to be polished, and the slurry particles upon completion of the chemical reaction generated in the polishing process grow into large particles by themselves or by reaction with each other, they may remain as residues on the layer to be polished by chemical bonding or mechanical friction with the layer to be polished or play a role of causing scratches or chatter marks on the surface of the layer to be polished.

Thus, the pores of the polishing pad may serve as microchannels through which these particles are allowed to easily escape from the interface between the polishing pad and the wafer during the polishing process without causing residues, surface scratches, or chatter marks.

In the void volume parameters, referring to FIG. 2(a), Vv(0) is the total void volume. It is the volume of voids bounded by the surface texture from the height (y-axis) corresponding to 0% (x-axis) of the percent data cut in the graph to the lowest valley (100%). Since Vv(0) is the total volume of voids in which a slurry can be carried, it may be a parameter most relevant to the flow channels of a slurry in the CMP process and the flowability of foreign substances generated during the CMP process.

Vvv(80) is the void volume of the valleys corresponding to the upper 80% to 100%. It is the volume of voids bounded by the surface texture from the height (y-axis) corresponding to 80% among 0% to 100% (x-axis) of the percent data cut in the graph to the lowest valley.

Here, the percentages, which are the references for the respective V parameters, can be adjusted.

Thus, the volume parameters can provide important information on the polishing performance determined by the mechanical friction and chemical reaction between the polishing pad, the wafer, and the slurry.

In the present invention, the volume parameters of the above relationships are maintained within certain ranges after the polishing process, and they are maintained to be constant during the polishing process, whereby it is possible to improve the polishing rate, residues, scratches, and chatter marks formed on the surface of the wafer.

According to an embodiment of the present invention, the polishing pad after polishing may satisfy a Vmp(10)/Vvv (80) value of 0.020 to 1.000 in Relationship 1. It is important in the semiconductor manufacturing process to have low characteristics of surface residues, surface scratches, and chatter marks at a specific polishing rate. If Vmp(10)/Vvv (80) is less than 0.020, in the polishing process using ceria particles, the contact ratio of the polishing pad to the wafer surface is low, whereas the ratio of pores is relatively high, so that the amount of slurry moving through the pores to contact the wafer and chemically react with the layer to be polished of the wafer is increased, resulting in an increase in the polishing rate. However, if the ratio of voids to the area where the surface of the polishing pad directly subjected to friction is too high, the void ratio is high when the crushed materials of the polishing pad, the polishing debris of the layer to be polished, and the slurry particles upon completion of the chemical reaction generated in the polishing process grow into large particles by themselves or by reaction with each other. Thus, it is more likely that they may be bonded to the wafer surface by chemical bonding, whereby they remain as residues.

If Vmp(10)/Vvv(80) is greater than 1.000, in the polishing process using ceria particles, the contact ratio of the polishing pad to the wafer surface is high, whereas the ratio of pores is relatively low, so that the amount of slurry moving through the pores to contact the wafer and chemically react with the layer to be polished of the wafer is decreased, resulting in a decrease in the polishing rate. On the other hand, if the ratio of the area where the surface of the polishing pad directly subjected to friction to voids is too high, it is more likely that scratches or chatter marks may be generated on the wafer surface due to shear stress between the area causing direct friction on the surface of the polishing pad and the wafer surface when the crushed materials of the polishing pad, the polishing debris of the layer to be polished, and the slurry particles upon completion of the chemical reaction generated in the polishing process grow into large particles.

Thus, when the ratio of Vmp(10)/Vvv(80) is maintained within an appropriate range, the number of residues, scratches, and chatter marks generated on the wafer surface can be minimized.

The polishing pad after polishing may satisfy the following Relationships 1-1 or 1-2:

$$0.030 \leq Vmp(10)/Vvv(80) \leq 0.990 \qquad \text{[Relationship 1-1]}$$

$$0.030 \leq Vmp(10)/Vvv(80) \leq 0.900 \qquad \text{[Relationship 1-2]}$$

In Relationships 1-1 and 1-2, Vmp(10) and Vvv(80) are as defined above.

In addition, Vmp(10)/Vvv(80) may be 0.040 to 0.800, 0.050 to 0.700, 0.070 to 0.500, 0.090 to 0.400, 0.100 to 0.400, 0.200 to 0.400, 0.090 to 0.300, or greater than 0.300 to 0.500.

In addition, according to an embodiment of the present invention, the polishing pad after polishing may satisfy a Vmp(10)/Vmc(10,80) value of 0.005 to 2.000 in Relationship 2.

If Vmp(10)/Vmc(10,80) is less than 0.005, the contact ratio of the polishing pad to the wafer surface is low, whereas the ratio of pores is relatively high, so that the amount of slurry moving through the pores to contact the wafer and chemically react with the layer to be polished of the wafer is increased, resulting in an increase in the polishing rate. On the other hand, if the ratio of voids to the area where the surface of the polishing pad directly subjected to friction is too high, the void ratio is high when the crushed materials of the polishing pad, the polishing debris of the layer to be polished, and the slurry particles upon completion of the chemical reaction generated in the polishing process grow into large particles by themselves or by reaction with each other. Thus, it is more likely that they may be bonded to the wafer surface, whereby they remain as residues.

If Vmp(10)/Vmc(10,80) is greater than 2.000, the contact ratio of the polishing pad to the wafer surface is high, whereas the ratio of pores is relatively low, so that the amount of slurry moving through the pores to contact the wafer and chemically react with the layer to be polished of the wafer is decreased, resulting in a decrease in the polishing rate. On the other hand, if the ratio of the area where the surface of the polishing pad directly subjected to friction to voids is too high, it is more likely that scratches or chatter marks may be generated on the wafer surface due to the pressure at the interface between the area causing direct friction on the surface of the polishing pad and the wafer surface when the crushed materials of the polishing pad, the polishing debris of the layer to be polished, and the slurry particles upon completion of the chemical reaction generated in the polishing process grow into large particles.

The polishing pad after polishing may satisfy the following Relationships 2-1 or 2-2:

$$0.010 \leq Vmp(10)/Vmc(10,80) \leq 1.600 \qquad \text{[Relationship 2-1]}$$

$$0.015 \leq Vmp(10)/Vmc(10,80) \leq 1.200 \qquad \text{[Relationship 2-2]}$$

In Relationships 2-1 and 2-2, Vmp(10) and Vmc(10,80) are as defined above.

In addition, Vmp(10)/Vmc(10,80) may be 0.010 to 1.000, 0.020 to 0.800, 0.020 to 0.600, 0.020 to 0.200, 0.020 to 0.100, 0.020 to 0.090, 0.030 to 0.080, 0.020 to 0.060, or greater than 0.060 to 0.200.

In addition, as long as Vmp(10)/Vvv(80) and Vmp(10)/Vmc(10,80) are within the above ranges, respectively, Vmp(10) may be 0.020 to 0.900, 0.040 to 0.800, 0.060 to 0.700, 0.080 to 0.600, or 0.100 to 0.500.

Vvv(80) may be 0.200 to 10.000, 0.200 to 9.600, 0.200 to 2.400, 0.300 to 2.300, 0.400 to 2.200, 0.500 to 2.100, or 0.600 to 2.000.

Vmc(10,80) may be 0.200 to 11.000, 0.250 to 10.000, 0.250 to 7.000, 1.000 to 11.000, 1.500 to 10.500, 2.000 to 10.000, 2.500 to 9.500, or 3.000 to 9.000.

Meanwhile, according to an embodiment of the present invention, the polishing pad after polishing may satisfy the following Relationship 3:

$$0.027 \leq Vmp(10)/\{Vv(0)+Vvv(80)+Vmc(10,80)\} \leq 3.100 \qquad \text{[Relationship 3]}$$

In Relationship 3, Vmp(10), Vv(0), Vvv(80), and Vmc(10,80) are as defined above.

Vv(0) may be 3.000 to 57.000, 6.000 to 54.000, 9.000 to 51.000, 12.000 to 48.000, or 15.000 to 45.000.

If the value of Relationship 3 exceeds 3.100, the polishing rate decreases in CMP using ceria, and surface residues, surface scratches, and chatter marks of the wafer may increase significantly. If the value of Relationship 3 is less than 0.027, the flowability of the slurry is excessive and the initial polishing rate is excessively increased, which may adversely affect the polishing performance, and surface residues, surface scratches, and chatter marks of the wafer may increase.

In addition, the polishing pad after polishing may satisfy the following Relationships 3-1 or 3-2:

$$0.042 \leq Vmp(10)/\{Vv(0)+Vvv(80)+Vmc(10,80)\} \leq 2.55 \qquad \text{[Relationship 3-1]}$$

$$0.057 \leq Vmp(10)/\{Vv(0)+Vvv(80)+Vmc(10,80)\} \leq 2.02 \qquad \text{[Relationship 3-2]}$$

In Relationships 3-1 and 3-2, Vmp(10), Vv(0), Vvv(80), and Vmc(10,80) are as defined above.

In addition, according to an embodiment of the present invention, the total sum of Vv(0), Vvv(80), and Vmc(10,80) may be 4.200 to 70.400, 7.800 to 66.800, 11.400 to 63.200, 12.000 to 59.600, or 18.600 to 56.000. The total sum of Vv(0), Vvv(80), and Vmc(10,80) may affect all of the mechanical polishing characteristics, friction characteristics, and slurry-carrying capability when the polishing pad contacts the wafer surface. Thus, as the polishing pad after polishing satisfies the total sum of Vv(0), Vvv(80), and Vmc(10,80) in the above range, it is possible to improve the polishing rate, surface residues, surface scratches, and chatter marks of the wafer.

If the total sum of Vv(0), Vvv(80), and Vmc(10,80) is less than the above range, the initial polishing rate is excessively increased, which may adversely affect the polishing performance, and surface residues, surface scratches, and chatter marks of the wafer may increase. If the total sum of Vv(0), Vvv(80), and Vmc(10,80) is greater than the above range, the polishing rate may be deteriorated, and the residue may be significantly increased.

In addition, the polishing pad after polishing may satisfy the above Relationships 1-1, 2-1, and 3-1 at the same time. Alternatively, the polishing pad after polishing may satisfy the above Relationships 1-2, 2-2, and 3-2 at the same time.

According to an embodiment of the present invention, the polishing pad after polishing may satisfy the above Relationship 4.

If Vmp(10)/Vv(0) is greater than 0.100, when the polishing pad contacts the surface of the semiconductor substrate (wafer), the mechanical polishing characteristics or friction characteristics are excessive, whereby scratches or chatter marks may be significantly increased. If Vmp(10)/Vv(0) is less than 0.002, the flowability of the slurry is excessive and the initial polishing rate is excessively increased, which may adversely affect the polishing performance, and surface residues, surface scratches, and chatter marks of the wafer may increase.

<Height Parameter of Surface Roughness>

Meanwhile, referring to FIG. 2(b), Spk is the reduced peak height, which provides an initial contact area when the polishing pad contacts the surface of a semiconductor substrate (or wafer) during the CMP process; thus, it refers to a surface composed of high peaks that provide a high contact stress area (force/area). Spk may refer to the nominal height of a material that can be removed during operation.

Sk is the core roughness depth, which refers to the core roughness of the surface on which the load can be distributed after the surface is worn.

Svk is the reduced valley depth, which is a value obtained by measuring the depth of the valleys under the core roughness of the surface and is related to the slurry-carrying capability or the trapping capability of polishing pad debris.

Meanwhile, in FIG. 2(b), SMr1 is the peak material portion, which refers to the ratio of the material constituting the peak structure related to Spk.

In addition, SMr2 is the valley material portion, which refers to the percentage (100%−SMr2) of the measurement area constituting the deeper valley structure related to Svk.

According to an embodiment of the present invention, as at least one of Relationships 5 to 7 is maintained within a certain range after polishing, it is possible to improve the polishing rate, surface residues, surface scratches, and chatter marks of the wafer.

Thus, according to an embodiment of the present invention, the polishing pad after polishing may satisfy the following Relationship 5:

$$Spk/Svk < 1.2 \quad \text{[Relationship 5]}$$

In Relationship 5, Spk and Svk are as defined above.

Spk/Svk in Relationship 5 may affect all of the mechanical polishing characteristics or friction characteristics and slurry-carrying capability when the polishing pad initially contacts the wafer surface. Thus, as the polishing pad after polishing satisfies the above Relationship 5, it is possible to improve the polishing rate, surface residues, surface scratches, and chatter marks of the wafer.

In addition, the polishing pad after polishing may satisfy the following Relationship 5-1:

$$0.2 \leq Spk/Svk \leq 1.1 \quad \text{[Relationship 5-1]}$$

In Relationship 5-1, Spk and Svk are as defined above.

In addition, the polishing pad after polishing may have an Spk/Svk value of 0.2 to 1.0, 0.2 to 0.7, 0.5 to less than 1.2, 0.7 to 1.1, or 0.3 to 0.7.

According to another embodiment of the present invention, the polishing pad after polishing may satisfy the following Relationship 6:

$$0.1 \leq Spk/Sk \leq 1.1 \quad \text{[Relationship 6]}$$

In Relationship 6, Spk and Sk are as defined above.

Spk/Sk in Relationship 6 may affect the mechanical polishing characteristics or friction characteristics when the polishing pad contacts the wafer surface after the initial contact. Thus, as the polishing pad after polishing satisfies the above Relationship 6, it is possible to improve the polishing rate, surface residues, scratches, and chatter marks of the wafer.

In addition, the polishing pad after polishing may satisfy the following Relationship 6-1:

$$0.2 \leq Spk/Sk \leq 1.1 \quad \text{[Relationship 6-1]}$$

In Relationship 6-1, Spk and Sk are as defined above.

In addition, the polishing pad after polishing may have an Spk/Sk value of 0.2 to 1.0, 0.3 to 1.1, 0.4 to 1.0, or 0.7 to 1.1.

According to another embodiment of the present invention, the polishing pad after polishing may satisfy the following Relationship 7:

$$0.2 \leq Svk/Sk \leq 2.5 \quad \text{[Relationship 7]}$$

In Relationship 7, Svk and Sk are as defined above.

Svk/Sk in Relationship 7 may affect the slurry-carrying capability when the polishing pad contacts the wafer surface after the initial contact. Thus, as the polishing pad after polishing satisfies the above Relationship 7, it is possible to improve the polishing rate, surface residues, surface scratches, and chatter marks of the wafer.

The polishing pad after polishing may satisfy the following Relationship 7-1:

$$0.4 \leq Svk/Sk \leq 2.5 \quad \text{[Relationship 7-1]}$$

In Relationship 7-1, Svk and Sk are as defined above.

In addition, the polishing pad after polishing may have an Svk/Sk value of 0.5 to 2.4, 0.9 to 2.4, 1.6 to 2.4, 1.6 to 2.0, or 0.5 to 1.5.

According to an embodiment of the present invention, Spk may be 2 to 10, 2.5 to 9.5, 2 to 7, 3 to 8, or 5.6 to 10.

Sk may be 5 to 40, 5 to 30, 6 to 26, 6 to 20, 10 to 30, or 6 to 10.

Svk may be greater than 11 to 22, greater than 11 to 20, 11.3 to 19.9, greater than 11 to 15, 13 to 20, or 12 to 15.

According to another embodiment of the present invention, the polishing pad after polishing may satisfy the following Relationship 8:

$$0.3 \leq Spk/Svk + Svk/Sk \leq 3.6 \quad \text{[Relationship 8]}$$

In Relationship 8, Spk, Svk, and Sk are as defined above.

The sum of Spk/Svk and Svk/Sk in Relationship 8 may affect the mechanical polishing characteristics or friction characteristics and slurry-carrying capability when the polishing pad initially contacts the wafer surface and the slurry-carrying capability after the initial contact. Thus, as the polishing pad after polishing satisfies the above Relationship 8, it is possible to improve the polishing rate, surface residues, surface scratches, and chatter marks of the wafer.

According to another embodiment of the present invention, the polishing pad after polishing may satisfy the following Relationship 9:

$$0.3 < Spk/Sk + Svk/Sk \leq 3.6 \quad \text{[Relationship 9]}$$

In Relationship 9, Spk, Svk, and Sk are as defined above.

The sum of Spk/Sk and Svk/Sk in Relationship 9 may affect all of the mechanical polishing characteristics or friction characteristics and slurry-carrying capability when the polishing pad contacts the wafer surface after the initial contact. Thus, as the polishing pad after polishing satisfies the above Relationship 9, it is possible to improve the polishing rate, surface residues, surface scratches, and chatter marks of the wafer.

According to another embodiment of the present invention, the polishing pad after polishing may satisfy the following Relationship 10:

$$0.45 \leq Spk/Sk + Svk/Sk + Spk/Svk \leq 4.7 \quad \text{[Relationship 10]}$$

In Relationship 10, Spk, Svk, and Sk are as defined above.

The sum of Spk/Sk, Svk/Sk, and Spk/Svk in Relationship 10 may affect all of the mechanical polishing characteristics or friction characteristics and slurry-carrying capability when the polishing pad initially contacts the wafer surface and after the initial contact. Thus, as the polishing pad after polishing satisfies the above Relationship 10, it is possible to improve the polishing rate, surface residues, surface scratches, and chatter marks of the wafer.

In addition, the polishing pad after polishing may satisfy the following Relationship 10-1:

$$0.8 \leq Spk/Sk + Svk/Sk + Spk/Svk \leq 4.6 \quad \text{[Relationship 10-1]}$$

In Relationship 10-1, Spk, Svk, and Sk are as defined above.

According to another embodiment of the present invention, the polishing pad after polishing may satisfy the following Relationship 11:

$$0.5 \leq (Spk + Svk)/Sk \leq 3.5 \quad \text{[Relationship 11]}$$

In Relationship 11, Spk, Svk, and Sk are as defined above.

(Spk+Svk)/Sk in Relationship 11 may affect all of the mechanical polishing characteristics or friction characteristics and slurry-carrying capability when the polishing pad contacts the wafer surface after the initial contact. Thus, as the polishing pad after polishing satisfies the above Relationship 11, it is possible to improve the polishing rate, surface residues, surface scratches, and chatter marks of the wafer.

In addition, the polishing pad after polishing may satisfy the following Relationship 11-1:

$$0.7 \leq (Spk + Svk)/Sk \leq 3.2 \quad \text{[Relationship 11-1]}$$

In Relationship 11-1, Spk, Svk, and Sk are as defined above.

The total sum of Spk and Svk in Relationships 11 and 11-1 may be greater than 13 to 32, 15 to 30, 15.5 to 29, 15 to 20, 17 to 30, or 17 to 20.

Surface Roughness of a Polishing Pad Before Polishing
According to an embodiment of the present invention, the surface roughness of the polishing pad before polishing may be within a range the same as, or similar to, the range of each parameter of the surface roughness after polishing, or it may fall outside the range of each parameter of the surface roughness after polishing. That is, regardless of the surface conditions of the polishing pad before polishing, as long as the surface roughness after polishing can be maintained within the above ranges, the polishing rate can be improved, and the surface residues, surface scratches, and chatter marks of the wafer can be reduced. However, the more similar the surface conditions of the polishing pad before and after polishing, the better from the viewpoint of polishing performance.

Specifically, according to an embodiment of the present invention, the absolute value of the difference in Vmp(10)/Vvv(80) between before and after polishing of the polishing pad may be 0.005 to 0.800, 0.005 to 0.700, 0.010 to 0.700, 0.010 to 0.400, 0.010 to 0.310, 0.005 to 0.030, or 0.300 to 0.700.

In addition, the absolute value of the difference in Vmp (10)/Vv(0) between before and after polishing of the polishing pad may be 0.002 to 0.087, 0.002 to 0.070, 0.002 to 0.020, or 0.01 to 0.09.

If the absolute value of the difference in Vmp(10)/Vvv (80) or Vmp(10)/Vv(0) between before and after polishing of the polishing pad satisfies the above range, the surface roughness both before and after polishing is constant, whereby the polishing performance can be enhanced.

In addition, the absolute value of the difference in Svk/Sk or Spk/Sk between before and after polishing of the polishing pad may be 1.5 or less, respectively.

Specifically, the absolute value of the difference in Svk/Sk between before and after polishing of the polishing pad may be 0.1 to 1.5, 0.2 to 1.5, 0.1 to 1.0, 0.1 to 0.7, or 0.8 to 1.5.

The absolute value of the difference in Spk/Sk between before and after polishing of the polishing pad may be 0 to 0.6, 0 to 0.5, 0 to 0.4, or 0.4 to 0.6.

If the absolute value of the difference in Svk/Sk or Spk/Sk between before and after polishing of the polishing pad satisfies the above range, the surface roughness both before and after polishing is constant, whereby the polishing performance can be enhanced.

[Process for Preparing a Polishing Pad]

The process for preparing a polishing pad according to an embodiment of the present invention comprises mixing a urethane-based prepolymer, a curing agent, and a foaming agent to prepare a raw material mixture; and injecting the raw material mixture into a mold and curing it to form a polishing layer, wherein when 25 dummy wafers are polished for 60 seconds each and two monitoring wafers are polished for 60 seconds each, both of which are each a silicon oxide wafer (or PETEOS wafer), while a calcined silica slurry is sprayed at a rate of 190 ml/min on to the polishing pad, the above Relationships 5 and 6 are satisfied in the areal material ratio curve based on the ISO 25178-2 standard when the polishing pad upon the polishing is measured with an optical surface roughness meter.

The process for preparing a polishing pad according to still another embodiment of the present invention comprises mixing a urethane-based prepolymer, a curing agent, and a foaming agent to prepare a raw material mixture; and injecting the raw material mixture into a mold and curing it to form a polishing layer, wherein the polishing pad satisfies the above Relationship 4 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

The process for preparing a polishing pad according to still another embodiment of the present invention comprises mixing a urethane-based prepolymer, a curing agent, and a foaming agent to prepare a raw material mixture; and injecting the raw material mixture into a mold and curing it to form a polishing layer, wherein the polishing pad satisfies the above Relationships 5 and 6 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

The process for preparing a polishing pad according to an embodiment of the present invention comprises mixing a urethane-based prepolymer, a curing agent, and a foaming agent to prepare a raw material mixture; and injecting the raw material mixture into a mold and curing it to form a polishing layer, wherein the polishing pad satisfies the above Relationship 11 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

The polishing pad comprises a polishing layer comprising a cured product formed from a composition comprising a urethane-based prepolymer, a curing agent, and a foaming agent, wherein the foaming agent may comprise at least one selected from the group consisting of a solid phase foaming agent, a liquid phase foaming agent, and a gas phase foaming agent. Alternatively, the foaming agent may comprise a solid phase foaming agent, a gas phase foaming agent, or a mixed foaming agent thereof.

Hereinafter, each component contained in the raw material mixture will be described below in detail.

Urethane-Based Prepolymer

The surface roughness of the polishing pad after polishing as desired in the present invention may be adjusted by varying the type of a urethane-based prepolymer.

The urethane-based prepolymer may be prepared by reacting an isocyanate compound with a polyol.

A prepolymer generally refers to a polymer having a relatively low molecular weight wherein the degree of polymerization is adjusted to an intermediate level for the sake of conveniently molding a product in the process of producing the same. A prepolymer may be molded by itself or after a reaction with another polymerizable compound. For example, a prepolymer may be prepared by reacting an isocyanate compound with a polyol.

For example, the isocyanate compound that may be used in the preparation of the urethane-based prepolymer may be at least one isocyanate selected from the group consisting of toluene diisocyanate (TDI), naphthalene-1,5-diisocyanate, p-phenylene diisocyanate, tolidine diisocyanate, 4,4'-diphenylmethane diisocyanate, hexamethylene diisocyanate, dicyclohexylmethane diisocyanate, and isophorone diisocyanate. But it is not limited thereto.

For example, the polyol that may be used in the preparation of the urethane-based prepolymer may be at least one polyol selected from the group consisting of a polyether polyol, a polyester polyol, a polycarbonate polyol, and an acryl polyol. But it is not limited thereto. The polyol may have a weight average molecular weight (Mw) of 300 g/mole to 3,000 g/mole.

The urethane-based prepolymer may have a weight average molecular weight of 500 g/mole to 3,000 g/mole. Specifically, the urethane-based prepolymer may have a weight average molecular weight (Mw) of 600 g/mole to 2,000 g/mole or 800 g/mole to 1,000 g/mole.

As an example, the urethane-based prepolymer may be a polymer having a weight average molecular weight (Mw) of 500 g/mole to 3,000 g/mole, which is polymerized from toluene diisocyanate as an isocyanate compound and polytetramethylene ether glycol as a polyol.

The urethane-based prepolymer has an isocyanate end group content (NCO %) of 8% by weight to 10% by weight, 8.5% by weight to 9.5% by weight, or 8.8% by weight to 9.4% by weight.

If the NCO % satisfies the above range, it is possible to maintain a constant surface roughness of the polishing pad after polishing as desired in the present invention, thereby improving the polishing rate and the characteristics of surface residues, surface scratches, and chatter marks of the wafer.

Foaming Agent

The plurality of pores in the polishing pad according to an embodiment of the present invention may be derived from a foaming agent.

The foaming agent may comprise at least one foaming agent selected from the group consisting of a solid phase foaming agent, a gas phase foaming agent, and a liquid phase foaming agent.

In addition, it is possible to control the change in the shape of micropores and the degree of pore coalescence occurring in the polishing pad depending on the type of the gas phase foaming agent, liquid phase foaming agent, or solid phase foaming agent, the average particle diameter of the solid phase foaming agent, and the presence or absence of a purification system for the solid phase foaming agent, thereby controlling the surface roughness of the polishing pad after polishing.

Solid Phase Foaming Agent

It is possible to control the shape of micropores and the pore coalescence phenomenon depending on the type, shape, or physical properties of the solid phase foaming agent. As a result, the surface roughness of the polishing pad after polishing can be adjusted.

The solid phase foaming agent is thermally expanded (i.e., size-controlled) microcapsules and may be in a structure of micro-balloons having an average pore size of 5 μm to 200 μm. The thermally expanded (i.e., size-controlled) microcapsules may be obtained by thermally expanding thermally expandable microcapsules.

The thermally expandable microcapsule may comprise a shell comprising a thermoplastic resin; and a foaming agent encapsulated inside the shell. The thermoplastic resin may be at least one selected from the group consisting of a vinylidene chloride-based copolymer, an acrylonitrile-based copolymer, a methacrylonitrile-based copolymer, and an acrylic-based copolymer. Further, the foaming agent encapsulated in the inside may be at least one selected from the group consisting of hydrocarbons having 1 to 7 carbon atoms. Specifically, the foaming agent encapsulated in the inside may be selected from the group consisting of a low molecular weight hydrocarbon such as ethane, ethylene, propane, propene, n-butane, isobutane, butene, isobutene, n-pentane, isopentane, neopentane, n-hexane, heptane, petroleum ether, and the like; a chlorofluorohydrocarbon such as trichlorofluoromethane ($CCl_3F$), dichlorodifluoromethane ($CCl_2F_2$), chlorotrifluoromethane ($CClF_3$), tetrafluoroethylene ($CClF_2$—$CClF_2$), and the like; and a tetraalkylsilane such as tetramethylsilane, trimethylethylsilane, trimethylisopropylsilane, trimethyl-n-propylsilane, and the like.

The solid phase foaming agent can precisely control the shape and size distribution of pores and the content of pores. The shape of micropores can be well maintained even during the CMP process by virtue of the presence of the outer wall of the solid phase foaming agent. However, since the solid phase foaming agent is in a structure of micro-balloons, it has a low density and a small size, thereby having a large surface tension. Thus, the thin and small spherical materials tend to coalesce together. Thus, even if the size of the solid phase foaming agent is controlled, it may not be easy to control the shape of the solid phase foaming agent, as well as the shape of micropores or the coalescence phenomenon of pores.

According to an embodiment of the present invention, the solid phase foaming agent is purified by a purification system, whereby it is possible to not only control the average particle diameter of the solid phase foaming agent, but also disperse it without coalescing together and filter out the solid phase foaming agent having a non-uniform shape. As a result, it is possible to control the shape and coalescence phenomenon of micropores and to control the surface roughness of the polishing pad after polishing. Thus, the average particle diameter, the standard deviation of the average particle diameter, or the density of the solid phase foaming agent may vary depending on the use of the purification system of the solid phase foaming agent.

For example, the average particle diameter (D50) of the solid phase foaming agent thus purified may be 5 μm to 200 μm. Here, the term D50 may refer to the volume fraction of the 50th percentile (median) in a particle diameter distribution. More specifically, the solid phase foaming agent may have a D50 of 7 μm to 100 μm. Even more specifically, the solid phase foaming agent may have a D50 of 10 μm to 50 μm; 15 μm to 45 μm; or 20 μm to 40 μm.

The purification system for a solid phase foaming agent may filter out the solid phase foaming agent having an average particle diameter that is too small or too large to satisfy the average particle diameter of the above range. It is possible to selectively control the average particle diameter of the solid phase foaming agent in the above range according to the required purpose.

If the D50 of the solid phase foaming agent satisfies the above range, the polishing rate and within-wafer non-uniformity can be further enhanced. If the D50 of the solid phase foaming agent is less than the above range, the number average diameter of pores may be decreased, which may have an impact on the polishing rate and within-wafer non-uniformity. If it exceeds the above range, the number average diameter of pores is excessively increased, which may have an adverse impact on the polishing rate and within-wafer non-uniformity.

If a solid phase foaming agent purified by the purification system for solid phase foaming agents as described above is used, the surface roughness of a polishing pad after polishing can be maintained to be uniform.

The solid phase foaming agent may be employed in an amount of 0.5 part by weight to 5 parts by weight based on 100 parts by weight of the raw material mixture. Specifically, the solid phase foaming agent may be employed in an amount of 0.6 part by weight to 2.5 parts by weight, 1 part by weight to 2.5 parts by weight, 1.5 parts by weight to 2.5 parts by weight, or 1.8 parts by weight to 2.3 parts by weight, based on 100 parts by weight of the urethane-based prepolymer.

In the preparation of a polishing pad of the present invention, a solid phase foaming agent may be used alone as a foaming agent or may be used in combination with a gas phase foaming agent and a volatile liquid phase foaming agent according to desired properties.

Purification System for the Solid Phase Foaming Agent

Various purification systems may be used as the purification system for a solid phase foaming agent as long as they can achieve the average particle diameter (D50) of the solid phase foaming agent in the above range and satisfy the surface roughness of the polishing pad as desired in the present invention.

According to an embodiment of the present invention, a classification and purification apparatus for a solid phase foaming agent is used as the purification system for a solid phase foaming agent.

The classification and purification apparatus for a solid phase foaming agent according to an embodiment comprises a classification unit for classifying a supplied solid foaming agent into first microspheres and second microspheres, a storage unit connected to the classification unit in which the classified first microspheres are introduced, stored, and discharged, and a filter unit disposed in the moving path of the solid phase foaming agent or the first microspheres to separate metallic materials from the object to be filtered that comprises the solid phase foaming agent or the first microspheres.

FIG. 3 is a schematic diagram showing the classification unit according to an embodiment. FIG. 4 is a diagram illustrating an operation state of the classification unit of FIG. 3.

Referring to FIGS. 3 and 4, the classification unit (50) comprises a classification housing (51) having a classification space (511) formed therein, a gas supply hole (515) connected to the classification space (511), and a classification discharge hole connected to the classification space (511). The classification unit (50) may further comprise a vortex generating member (53) positioned in the classification space (511) and disposed adjacent to the gas supply hole (515). The classification unit (50) may further comprise a vibration generating unit (56) disposed in the classification housing (51). The classification unit (50) may further comprise a classifying and stirring unit.

Classification of the solid phase foaming agent introduced into the classification space (511) through any of the classification inlet holes (512) may be performed as follows. In the classification space (511), a fluidizing gas is supplied to classify the solid phase foaming agent. The fluidizing gas introduced into the classification space (511) flows in the direction of the gas discharge hole (516) while it passes through the vortex generating member (53). In such event, the fluidizing gas flows while it generates rotation or vortexes (dashed arrow in the classification space (511) of FIG. 4: marked as A). The fluidizing gas flows to the top where the gas discharge hole (516) is located. The solid phase foaming agent introduced into the classification space (511) rises along the fluidizing gas that is flowing and then falls within the classification space (511) promoted by a downward flow generated as the flow of the fluidizing gas is weakened or by rotational force, vibration, or the like transmitted from the outside (in FIG. 4, the flow of the solid phase foaming agent is indicated by a double-dashed line arrow: B, and a vibration arrow: C). In such event, the flow of air in the classification space (511) forms a circulating flow of air cells, so that when the particles of the solid phase foaming agent are heavy or too light relative to their size or when the shape of the particles is remarkably different, the rising or falling speed thereof varies so that they are classified. That is, the solid phase foaming agent is fluidized in the classification space (511) with the flow of the fluidizing gas, and the solid phase foaming agent falls at different speeds according to its weight and size under the influence of gravity, vibration, and the like, so that it can be classified and recovered according to the size.

The solid phase foaming agent rising or falling under the influence of the fluidizing gas as described above may be discharged outside the classification housing (51) through first microsphere discharge holes (513) and second microsphere discharge holes (514) formed according to the height of the classification housing (51), respectively.

A gas discharge hole (516) through which the fluidizing gas introduced into the classification space (511) is discharged may be formed on the top side of the classification housing (51). A discharge filter (54) for filtering foreign matters, residual microspheres, and the like contained in the discharged fluidizing gas is disposed in the gas discharge hole (516).

In an embodiment, the vibration process may be performed as a vertical vibration that moves up and down around the central axis (511*a*) to the classification housing (51) through the vibration generating unit (56), a horizontal vibration that moves left and right, or a vertical and horizontal vibration applied in both the vertical and horizontal directions sequentially or simultaneously. In addition, the vibration process may be performed by repeatedly rotating the classification housing (51) clockwise or counterclockwise with respect to the central axis (511*a*) or repeating the rotation in clockwise and counterclockwise directions. In such event, the frequency applied to the vibration process may be, for example, 100 to 10,000 Hz, 500 to 5,000 Hz, or 700 to 3,500 Hz. When a vibration within the above range is applied, the solid phase foaming agent can be more efficiently classified.

Due to the characteristics of a relatively small and light solid phase foaming agent, it can be classified by the difference in the rising and falling speeds of the solid phase foaming agent with the flow of the fluidizing gas. In addition, the hollow microspheres, which rise by the fluidizing gas but hardly fall, can readily fall by the vibration. That is, the vibration process may be carried out in a manner of a down force vibration that promotes the falling of the solid phase foaming agent in the classification space (511). If the vibration process proceeds further, more efficient and effective classification can be performed. The polishing layer formed through this process can provide a semiconductor substrate with fewer surface defects such as surface residues, surface scratches, and chatter marks of the wafer.

The particle diameter of the classified solid phase foaming agent may be adjusted by the flow rate of the injected fluidizing gas, the position of the first microsphere discharge hole (513), the degree of vibration, and the like. As a result, the solid phase foaming agent may be classified into first microspheres having an average particle diameter of about 5 µm to about 200 µm and second microspheres having an average particle diameter of less than about 5 µm. The solid phase foaming agent that is damaged or has too high a density may be the third microspheres. Thus, the solid phase foaming agent may be classified into first to third microspheres in the classification space (511). The particle size of the classified solid phase foaming agent may hinge upon the design of the polishing pad.

FIG. 5 is an exploded perspective view of the filter unit (30*a*, 30*b*) according to an embodiment. Referring to FIGS. 3 and 5, the filter units (30*a*, 30*b*) may be disposed at the front end, the rear end, or the front and rear ends of the classification unit. The filter unit (30*b*) disposed at the rear end of the classification unit may remove metal components in the first microspheres separated through the classification space (511). The filter unit (30*a*) disposed at the front end of the classification unit may remove metal components from the solid phase foaming agent before it is introduced to the classification unit (50).

Referring to FIG. 5, the filter unit (30*a*, 30*b*) comprises a filter housing (31) having a filter space (311) therein through which the solid phase foaming agent passes through, a filter cover (32) detachably disposed to the filter housing (31) to open and close the filter space (311), and a filter member (33) disposed in the filter space (311) and generating magnetic force.

A filter inlet (312) connected to the pipes (10*a* and 10*c*) may be formed in the filter housing (31). The solid phase foaming agent is introduced into the filter space (311) through the filter inlet (312) and may move in an open direction while rotating along the circumference of the filter space (311). The filter member (33) is located in the filter space (311), which may induce the generation of vortexes in the flow of the solid phase foaming agent.

In an embodiment, a filter outlet (321) connected to the filter space (311) may be formed in the filter cover (32). In another embodiment, the filter outlet (321) may be formed in the periphery of the filter housing (31). The location of the filter outlet (321) may vary with the type or density of the object to be filtered. The solid phase foaming agent passing through the filter space (311) through the filter inlet (312) may be discharged to the outside of the filter housing (31) through the filter outlet (321).

The filter member (33) may comprise a mounting member (331) positioned in the filter space (311) and a magnet (332) disposed in the mounting member (331). In an embodiment, the magnet (332) may be disposed inside the mounting member (331). The magnet (332) may comprise a permanent magnet or an electromagnet. The magnet may be a neodymium magnet. The magnet may have a magnetic force of 10,000 Gauss to 12,000 Gauss. The magnet generates a magnetic field around the mounting member (331), and a metallic material adheres to the magnet. The metallic material contained in the solid phase foaming agent that rotates in the filter space (311) may adhere to the outer periphery of the mounting member (331) by the magnetic force. The metallic material mixed with the object to be filtered that passes through the filter space (311) may be separated by the magnet (332). A purified solid phase foaming agent or first microspheres may be provided through the filter unit.

As the solid phase foaming agent is processed through the classification unit, the performance of roughness control in the surface processing of a polishing pad prepared using the same may be enhanced. If the size of the solid phase foaming agent is too small, the composition for preparing a polishing pad may aggregate. If the size of the solid phase foaming agent is too large, it is difficult to control the pore size, thereby deteriorating the surface characteristics of the polishing pad. Therefore, as a solid phase foaming agent of an appropriate size is provided through the classification unit, it is possible to prevent the composition for preparing a polishing pad from aggregating. Furthermore, the roughness characteristics with a uniform and suitable depth/width on the surface of a polishing pad can be achieved.

In addition, the metallic foreign matters with high density in the solid phase foaming agent, the aggregates formed therefrom as a seed, and the like affect the surface conditions of a polishing pad and act as an obstacle to processing the desired level of roughness characteristics. Thus, the use of the solid phase foaming agent from which metal components have been removed through the filter unit can minimize the foreign matters with a high density and the aggregates to be contained in the polishing pad. As a result, it is possible to secure an effect of enhancing the quality, such as remarkably reduced defects of products such as semiconductor substrates polished with a polishing pad having excellent surface characteristics.

Gas Phase Foaming Agent

The surface roughness of the polishing pad after polishing as desired in the present invention may be adjusted by varying the type of a gas phase foaming agent.

The gas phase foaming agent may comprise an inert gas. The gas phase foaming agent may be fed when the urethane-based prepolymer, the curing agent, the solid phase foaming agent, the reaction rate controlling agent, and the silicone-based surfactant are mixed and reacted, to thereby form pores. The kind of the inert gas is not particularly limited as long as it is a gas that does not participate in the reaction between the prepolymer and the curing agent. For example, the inert gas may be at least one selected from the group consisting of nitrogen gas ($N_2$), argon gas (Ar), and helium gas (He). Specifically, the inert gas may be nitrogen gas ($N_2$) or argon gas (Ar).

The gas phase foaming agent may be fed in a volume of 5% to 30% based on the total volume of the raw material mixture, specifically the total volume of the urethane-based prepolymer, the foaming agent, the reaction rate controlling agent, and the curing agent. Specifically, the gas phase foaming agent may be fed in a volume of 5% by volume to 30% by volume, 5% by volume to 25% by volume, 5% by volume to 20% by volume, 5% by volume to 18% by volume, 6% by volume to 15% by volume, 6% by volume to 13% by volume, or 7.5% by volume to 10% by volume, based on the total volume of the raw material mixture.

Liquid Phase Foaming Agent

The surface roughness of the polishing pad after polishing as desired in the present invention may be adjusted by varying the type and mixing process of a liquid phase foaming agent.

The liquid phase foaming agent may be introduced during the mixing and reaction of the prepolymer and the curing agents to form pores. It does not participate in the reaction between the prepolymer and the curing agents. In addition, the liquid phase foaming agent is physically vaporized by heat generated during the mixing and reaction of the prepolymer and the curing agents to form pores.

The liquid phase foaming agent may comprise two or more volatile liquid phase foaming agents having different boiling points. Specifically, the volatile liquid phase foaming agent may comprise one or more low-boiling point liquid phase foaming agents and one or more high-boiling point liquid phase foaming agents.

The volatile liquid phase foaming agent may be liquid at 25° C. while it does not react with an isocyanate group, an amide group, and an alcohol group. Specifically, the volatile liquid phase foaming agent may be selected from the group consisting of trichlorofluoromethane, 2,2-dichloro-1,1,1-trifluoroethane, 1,1-dichloro-1-fluoroethane, cyclopentane, n-pentane, cyclohexane, n-butyl acetate, bis(nonafluorobutyl)(trifluoromethyl)amine; and perfluoro compounds such as perfluorotributylamine, perfluoro-N-methylmorpholine, perfluorotripentylamine, and perfluorohexane.

Commercially available products of the perfluoro compound include FC-40 (3M), FC-43 (3M), FC-70 (3M), FC-72 (3M), FC-770 (3M), FC-3283 (3M), and FC-3284 (3M).

The low-boiling point liquid phase foaming agent may be vaporized at the beginning of the reaction to form mesopores having an average pore diameter of 45 to 90 μm. Specifically, the low-boiling point liquid phase foaming agent may have a boiling point of 30 to 100° C. at 1 atm. More specifically, the low-boiling point liquid phase foaming agent may have a boiling point of 40 to 70° C. at 1 atm. Even more specifically, the low-boiling point liquid phase foaming agent may be at least one selected from the group consisting of trichlorofluoromethane, 2,2-dichloro-1,1,1-trifluoroethane, 1,1-dichloro-1-fluoroethane, cyclopentane, cyclohexane, n-pentane, perfluoro-N-methylmorpholine, and perfluorohexane. Commercially available products of the low-boiling point liquid phase foaming agent include FC-72 (3M), FC-770 (3M), and FC-3284 (3M).

The high-boiling point liquid phase foaming agent may be vaporized with a delay to form micropores having an average pore diameter of 20 to 50 Specifically, the high-boiling point liquid phase foaming agent may have a boiling point of 100 to 250° C. at 1 atm. More specifically, the high-boiling point liquid phase foaming agent may have a boiling point of 100 to 200° C. at 1 atm. More specifically, the high-boiling point liquid phase foaming agent may be at least one selected from the group consisting of n-butyl acetate, bis(nonafluorobutyl)(trifluoromethyl)amine, perfluorotributylamine, and perfluorotripentylamine. Commercially available products of the high-boiling point liquid phase foaming agent include FC-40 (3M), FC-43 (3M), FC-70 (3M), and FC-3283 (3M).

The low-boiling point liquid phase foaming agent and the high-boiling point liquid phase foaming agent may have a boiling point difference of 20 to 80° C., specifically 50 to 80° C. Specifically, examples of the combination of the low-boiling point liquid phase foaming agent and the high-boiling point liquid phase foaming agent include combinations of cyclopentane and n-butyl acetate, and trichlorofluoromethane and bis(nonafluorobutyl)(trifluoromethyl)amine.

The volatile liquid phase foaming agent may comprise the low-boiling point liquid phase foaming agent and the high-boiling point liquid phase foaming agent at a molar ratio of 1:0.5 to 2. Specifically, the volatile liquid phase foaming agent may comprise the low-boiling point liquid phase foaming agent and the high-boiling point liquid phase foaming agent at a molar ratio of 1:0.8 to 1.2. The liquid phase foaming agent may be employed in an amount of 1 to 10 parts by weight based on 100 parts by weight of the raw material mixture. In addition, the liquid phase foaming agent may be employed in an amount of 2 to 8 parts by weight based on 100 parts by weight of the raw material mixture.

Curing Agent

The curing agent may be at least one of an amine compound and an alcohol compound. Specifically, the curing agent may comprise at least one compound selected from the group consisting of an aromatic amine, an aliphatic amine, an aromatic alcohol, and an aliphatic alcohol.

For example, the curing agent may be at least one selected from the group consisting of 4,4'-methylenebis(2-chloroaniline) (MOCA), diethyltoluenediamine, diaminodiphenylmethane, diaminodiphenyl sulphone, m-xylylene diamine, isophoronediamine, ethylenediamine, diethylenetriamine, triethylenetetramine, polypropylenediamine, polypropylenetriamine, ethylene glycol, diethylene glycol, dipropylene glycol, butanediol, hexanediol, glycerin, trimethylolpropane, and bis(4-amino-3-chlorophenyl)methane.

The urethane-based prepolymer and the curing agent may be mixed at a molar equivalent ratio of 1:0.8 to 1:1.2, or a molar equivalent ratio of 1:0.9 to 1:1.1, based on the number of moles of the reactive groups in each molecule. Here, "the number of moles of the reactive groups in each molecule" refers to, for example, the number of moles of the isocyanate group in the urethane-based prepolymer and the number of moles of the reactive groups (e.g., amine group, alcohol group, and the like) in the curing agent. Therefore, the urethane-based prepolymer and the curing agent may be fed at a constant rate during the mixing process by controlling the feeding rate such that the urethane-based prepolymer and the curing agent are fed in amounts per unit time that satisfies the molar equivalent ratio exemplified above.

The curing agent may be employed in an amount of 3.0 parts by weight to 40 parts by weight based on 100 parts by weight of the raw material mixture. Specifically, the curing agent may be employed in an amount of 5.0 parts by weight to 35 parts by weight based on 100 parts by weight of the raw material mixture. Specifically, the curing agent may be employed in an amount of 7.0 parts by weight to 30 parts by weight based on 100 parts by weight of the raw material mixture.

Surfactant

The raw material mixture may further comprise a surfactant. The surfactant may act to prevent the pores to be formed from overlapping and coalescing with each other. Specifically, the surfactant is preferably a silicone-based nonionic surfactant. But other surfactants may be variously selected depending on the physical properties required for the polishing pad.

As the silicone-based nonionic surfactant, a silicone-based nonionic surfactant having a hydroxyl group may be used alone or in combination with a silicone-based nonionic surfactant having no hydroxyl group.

The silicone-based nonionic surfactant having a hydroxyl group is not particularly limited as long as it is widely used in the polyurethane technology industry since it is excellent in compatibility with an isocyanate-containing compound and an active hydrogen compound. Examples of the silicone-based nonionic surfactant having a hydroxyl group, which is commercially available, include DOW CORNING 193 (a silicone glycol copolymer in a liquid phase having a specific gravity at 25° C. of 1.07, a viscosity at 20° C. of 465 mm$^2$/s, and a flash point of 92° C.) (hereinafter referred to as DC-193) manufactured by Dow Corning.

Examples of the silicone-based nonionic surfactant having no hydroxyl group, which is commercially available, include DOW CORNING 190 (a silicone glycol copolymer having a Gardner color number of 2, a specific gravity at 25° C. of 1.037, a viscosity at 25° C. of 2,000 mm$^2$/s, a flash point of 63° C. or higher, and an inverse solubility point (1.0% water solution) of 36° C. (hereinafter referred to as DC-190) manufactured by Dow Corning.

The surfactant may be employed in an amount of 0.1 to 2 parts by weight based on 100 parts by weight of the raw material mixture. Specifically, the surfactant may be employed in an amount of 0.2 to 1.8 parts by weight, 0.2 to 1.7 parts by weight, 0.2 to 1.6 parts by weight, or 0.2 to 1.5 parts by weight, based on 100 parts by weight of the raw material mixture. If the amount of the surfactant is within the above range, pores derived from the gas phase foaming agent can be stably formed and maintained in the mold.

Reaction and Formation of Pores

The urethane-based prepolymer and the curing agent react with each other upon the mixing thereof to form a solid polyurethane, which is then formed into a sheet or the like. Specifically, the isocyanate terminal group in the urethane-based prepolymer can react with the amine group, the alcohol group, and the like in the curing agent. In such event, a foaming agent such as a solid phase foaming agent is uniformly dispersed in the raw materials to form pores without participating in the reaction between the urethane-based prepolymer and the curing agent.

Molding

The molding is carried out using a mold. Specifically, the raw material mixture sufficiently stirred in a mixing head or the like may be injected into a mold to fill the inside thereof.

Control of the sphericity of a plurality of pores contained in the polishing pad according to an embodiment of the present invention may be performed using the rotational speed of the mixing head and the purification system for a solid phase foaming agent. Specifically, in the process of mixing and dispersing the urethane-based prepolymer, the solid phase foaming agent, and the curing agent, they are mixed by, for example, a mixing system at a rotational speed of the mixing head of, for example, 500 rpm to 10,000 rpm, 700 rpm to 9,000 rpm, 900 rpm to 8,000 rpm, 900 rpm to 7,000 rpm, or 1,000 to 5,000 rpm. Alternatively, in the process of mixing and dispersing the urethane-based prepolymer, the solid phase foaming agent, and the curing agent, the solid phase foaming agent purified by the purification system may be used.

The reaction between the urethane-based prepolymer and the curing agent is completed in the mold to thereby produce a molded body in the form of a solidified cake that conforms to the shape of the mold.

Thereafter, the molded body thus obtained may be appropriately sliced or cut into a sheet for the production of a polishing pad. As an example, a molded body is prepared in a mold having a height of 5 to 50 times the thickness of a polishing pad to be finally produced and is then sliced in the same thickness to produce a plurality of sheets for the polishing pads at a time. In such event, a reaction retarder may be used as a reaction rate controlling agent in order to secure a sufficient solidification time. Thus, the height of the mold may be about 5 to about 50 times the thickness of the polishing pad to be finally produced to prepare sheets therefor. However, the sliced sheets may have pores of different diameters depending on the molded location inside the mold. That is, a sheet molded at the lower position of the mold may have pores of a fine diameter, whereas a sheet molded at the upper position of the mold may have pores of a larger diameter than that of the sheet formed at the lower position.

Therefore, it is preferable to use a mold capable of producing one sheet by one molding in order for each sheet to have pores of a uniform diameter. To this end, the height of the mold may not significantly differ from the thickness of the polishing pad to be finally produced. For example, the molding may be carried out using a mold having a height of 1 to 3 times the thickness of the polishing pad to be finally produced. More specifically, the mold may have a height of 1.1 to 3.0 times, or 1.2 to 3.0 times, the thickness of the polishing pad to be finally produced. In such event, a reaction promoter may be used as the reaction rate controlling agent to form pores having a more uniform diameter. The polishing pad prepared from a single sheet may have a thickness of 1 mm to 10 mm. Specifically, the polishing pad may have a thickness of 1 mm to 9 mm, 1 mm to 8.5 mm, 1.5 mm to 10 mm, 1.5 mm to 9 mm, 1.5 mm to 8.5 mm, 1.8 mm to 10 mm, 1.8 mm to 9 mm, or 1.8 mm to 8.5 mm.

Thereafter, the top and bottom ends of the molded body obtained from the mold may be cut out, respectively. For example, each of the top and bottom ends of the molded body may be cut out by 1/3 or less, 1/22 to 3/10, or 1/12 to 1/4 of the total thickness of the molded body.

As a specific example, the molding is carried out using a mold having a height of 1.2 to 2 times the thickness of the polishing pad to be finally produced, and a further step of cutting out each of the top and bottom ends of the molded body obtained from the mold upon the molding by 1/12 to 1/4 of the total thickness of the molded body may then be carried out.

Subsequent to the above cutting step, the above preparation process may further comprise the steps of machining grooves on the surface of the molded body, bonding with the lower part, inspection, packaging, and the like. These steps may be carried out in a conventional manner for preparing a polishing pad.

In addition, the polishing pad prepared by the preparation process as described above may have all of the characteristics of the polishing pad according to the embodiment as described above.

[Physical Properties of the Polishing Pad]

As described above, the polishing pad according to an embodiment controls each parameter of the surface roughness of the polishing pad after polishing, whereby the polishing rate can be enhanced, and the surface residues, surface scratches, and chatter marks of the wafer can be reduced.

Specifically, when a silicon wafer on which a silicon oxide film has been formed is polished using a calcined ceria slurry, the polishing pad may have a polishing rate of 2,600 Å/min to 3,300 Å/min, 2,850 Å/min to 3,200 Å/min, 2,900 Å/min to 3,100 Å/min, or 2,900 Å/min to 3,000 Å/min, for the oxide layer.

In addition, when 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, the number of chatter marks of the monitoring wafer may be 5 or less, 1 to 5, 1 to 4, or 1 to 3.

In addition, the number of surface scratches of the monitoring wafer after polishing may be is 200 or less, 1 to 200, 1 to 180, 1 to 160, or 1 to 150.

In addition, the number of surface residues on the monitoring wafer after polishing may be 100 or less, 90 or less, 86 or less, or 80 or less.

Meanwhile, the polishing pad comprises a plurality of pores.

In the polishing pad according to an embodiment of the present invention, the average diameter of the plurality of pores may be 5 μm to 200 μm. In addition, the average diameter of the plurality of pores may be 7 μm to 100 μm, 10 μm to 50 μm, 10 μm to 32 μm, or 20 μm to 32 μm. The average diameter of the plurality of pores was calculated as a number average value of the pore diameters. For example, the polishing pad was observed with a scanning electron microscope (SEM) at a magnification of 200 times. The diameter of each pore was measured from an image obtained using an image analysis software, from which the average diameter ($D_a$) was calculated. The average diameter was defined as an average value obtained by dividing the sum of the diameters of the plurality of pores by the number of the pores in 1 $mm^2$ of the polishing surface.

The pores include closed pores disposed inside the polishing pad and open pores disposed on the polishing surface of the polishing pad.

Specifically, in the open pores, the pore inlet is exposed on the polishing surface.

Here, the diameter of the inlet of an open pore may refer to a diameter of a circle having the same planar area as that of the inlet of the open pore. In addition, the average diameter of the inlets of open pores may be calculated by number-averaging the diameters of the inlets of the plurality of open pores present on the polishing surface.

The total number of pores may be 700 or more per unit area ($mm^2$) of the polishing pad. More specifically, the total number of pores may be 750 or more per unit area ($mm^2$) of the polishing pad. Even more specifically, the total number of pores may be 800 or more per unit area ($mm^2$) of the polishing pad. Even more specifically, the total number of pores may be 900 or more per unit area ($mm^2$) of the polishing pad. But it is not limited thereto. In addition, the total number of pores may be 2,500 or less, specifically 2,200 or less, 1,500 or less, or 1,200 or less, per unit area ($mm^2$) of the polishing pad, but it is not limited thereto. Thus, the total number of pores may be 700 to 2,500, for example, 750 to 2,200, 800 to 1,500, or 800 to 1,200, per unit area ($mm^2$) of the polishing pad, but it is not limited thereto.

Specifically, the polishing pad may have an elastic modulus of 60 $kgf/cm^2$ or more. More specifically, the polishing pad may have an elastic modulus of 100 $kgf/cm^2$ or more, but it is not limited thereto. The upper limit of the elastic modulus of the polishing pad may be 150 $kgf/cm^2$, but it is not limited thereto.

In addition, the polishing pad according to an embodiment may be excellent in polishing performance, as well as basic physical properties of a polishing pad such as breakdown voltage, specific gravity, surface hardness, tensile strength, and elongation.

The physical properties of the polishing pad such as specific gravity and hardness can be controlled through the molecular structure of the urethane-based prepolymer polymerized by the reaction between an isocyanate and a polyol.

Specifically, the polishing pad may have a surface hardness of 45 Shore D to 65 Shore D at 25° C. More specifically, the polishing pad may have a hardness of 50 Shore D to 65 Shore D, but it is not limited thereto.

Specifically, the polishing pad may have a specific gravity of 0.6 $g/cm^3$ to 0.9 $g/cm^3$. More specifically, the polishing pad may have a specific gravity of 0.7 $g/cm^3$ to 0.85 $g/cm^3$, but it is not limited thereto.

Specifically, the polishing pad may have a tensile strength of 10 $N/mm^2$ to 100 $N/mm^2$. More specifically, the polishing pad may have a tensile strength of 15 $N/mm^2$ to 70 $N/mm^2$. Even more specifically, the polishing pad may have a tensile strength of 20 $N/mm^2$ to 70 $N/mm^2$, but it is not limited thereto.

Specifically, the polishing pad may have an elongation of 30% to 300%. More specifically, the polishing pad may have an elongation of 50% to 200%.

The polishing pad may have a breakdown voltage of 14 kV to 23 kV, a thickness of 1.5 mm to 2.5 mm, a specific gravity of 0.7 $g/cm^3$ to 0.9 $g/cm^3$, a surface hardness at 25° C. of 50 shore D to 65 shore D, a tensile strength of 15 $N/mm^2$ to 25 $N/mm^2$, and an elongation of 80% to 250%, but it is not limited thereto.

The polishing pad may have a thickness of 1 mm to 5 mm. Specifically, the polishing pad may have a thickness of 1 mm to 3 mm, 1 mm to 2.5 mm, 1.5 mm to 5 mm, 1.5 mm to 3 mm, 1.5 mm to 2.5 mm, 1.8 mm to 5 mm, 1.8 mm to 3 mm, or 1.8 mm to 2.5 mm. If the thickness of the polishing pad is within the above range, the basic physical properties of a polishing pad can be sufficiently exhibited.

Meanwhile, the polishing pad may have grooves on its surface for mechanical polishing. The grooves may have a depth, a width, and a spacing as desired for mechanical polishing, which are not particularly limited.

The polishing pad according to an embodiment may simultaneously have the physical properties of the polishing pad as described above.

[Process for Preparing a Semiconductor Device]

The process for preparing a semiconductor device according to the present invention may comprise providing a polishing pad comprising a polishing layer; and relatively rotating the polishing surface of the polishing layer and the surface of an object to be polished while they are in contact with each other to polish the object to be polished.

Specifically, the process for preparing a semiconductor device according to an embodiment of the present invention comprises mounting a polishing pad comprising a polishing layer on a platen; and relatively rotating the polishing surface of the polishing layer and the surface of a wafer while they are in contact with each other to polish the surface of the wafer, wherein the polishing pad satisfies the above Relationships 5 and 6 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

The process for preparing a semiconductor device according to another embodiment of the present invention comprises mounting a polishing pad comprising a polishing layer on a platen; and relatively rotating the polishing surface of the polishing layer and the surface of a wafer while they are in contact with each other to polish the surface of the wafer, wherein the polishing pad satisfies the above Relationships 1 and 2 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter.

The process for preparing a semiconductor device according to still another embodiment of the present invention comprises mounting a polishing pad comprising a polishing layer on a platen; and relatively rotating the polishing surface of the polishing layer and the surface of a wafer while they are in contact with each other to polish the surface of the wafer, wherein when 25 dummy wafers are polished for 60 seconds each and two monitoring wafers are polished for 60 seconds each, both of which are each a silicon oxide wafer (or PETEOS wafer), while a calcined silica slurry is sprayed at a rate of 190 ml/min on to the polishing pad, the above Relationship 4 is satisfied in the areal material ratio curve based on the ISO 25178-2 standard when the polishing pad upon the polishing is measured with an optical surface roughness meter.

The process for preparing a semiconductor device according to still another embodiment of the present invention comprises mounting a polishing pad comprising a polishing layer on a platen; and relatively rotating the polishing surface of the polishing layer and the surface of a wafer while they are in contact with each other to polish the surface of the wafer, wherein when 25 dummy wafers are polished for 60 seconds each and two monitoring wafers are polished for 60 seconds each, both of which are each a silicon oxide wafer (or PETEOS wafer), while a calcined silica slurry is sprayed at a rate of 190 ml/min on to the polishing pad, the above Relationship 11 is satisfied in the areal material ratio curve based on the ISO 25178-2 standard when the polishing pad upon the polishing is measured with an optical surface roughness meter.

Specifically, once the polishing pad according to an embodiment is mounted on a platen, a semiconductor substrate is disposed on the polishing pad. In such event, the semiconductor substrate may be a wafer, and the surface of the wafer is in direct contact with the polishing surface of the polishing pad. A polishing slurry may be sprayed through a nozzle on the polishing pad for polishing. The flow rate of the polishing slurry supplied through the nozzle may be selected according to the purpose within a range of about 10 cm$^3$/min to about 1,000 cm$^3$/min. For example, it may be about 50 cm$^3$/min to about 500 cm$^3$/min, but it is not limited thereto.

Thereafter, the wafer and the polishing pad rotate relatively to each other, so that the surface of the wafer may be polished. In such event, the rotation direction of the wafer and the rotation direction of the polishing pad may be the same direction or opposite directions. The rotation speeds of the wafer and the polishing pad may be selected according to the purpose within a range of about 10 rpm to about 500 rpm. For example, it may be about 30 rpm to about 200 rpm, but it is not limited thereto.

The wafer mounted on the polishing head is pressed against the polishing surface of the polishing pad at a predetermined load to be in contact therewith, the surface thereof may then be polished. The load applied by the polishing head to make the surface of the wafer in contact with the polishing surface of the polishing pad may be selected according to the purpose within a range of about 1 gf/cm$^2$ to about 1,000 gf/cm$^2$. For example, it may be about 10 gf/cm$^2$ to about 800 gf/cm$^2$, but it is not limited thereto.

In an embodiment, in order to maintain the polishing surface of the polishing pad in a state suitable for polishing, the process for preparing a semiconductor device may further comprise processing the polishing surface of the polishing pad with a conditioner simultaneously with polishing the wafer.

According to an embodiment, when the polishing pad upon the polishing is measured with an optical surface roughness meter, as the volume parameters of surface roughness and the height parameters of surface roughness are controlled within specific ranges in the areal material ratio curve based on the ISO 25178-2 standard, a polishing pad is provided in which the polishing rate can be enhanced, and the surface residues, surface scratches, and chatter marks of the wafer can be reduced. It is possible to efficiently fabricate a semiconductor device of excellent quality using the same.

Mode for the Invention

Hereinafter, the present invention is explained in detail by the following Examples. However, these examples are set forth to illustrate the present invention, and the scope of the present invention is not limited thereto.

Example 1

Preparation of a Polishing Pad (1) Preparation of a Urethane-Based Prepolymer

A four-necked flask was charged with polytetramethylene ether glycol (Korea PTG) as a polyol and toluene diisocyanate (BASF) as an isocyanate compound. The inside of the reactor was filled with nitrogen (N₂) as an inert gas, and the reaction was carried out at a reaction temperature of 75° C. with stirring for 75 hours to prepare a urethane-based prepolymer. Here, the NCO % was adjusted to 9.1%.

(2) Preparation of a Polishing Pad

A casting machine equipped with tanks and feeding lines for the raw materials such as a urethane-based prepolymer, a curing agent, and a foaming agent was provided. The urethane-based prepolymer prepared above and MOCA (4,4'-methylne bis(2-chloroaniline); Sigma-Aldrich) as a curing agent were prepared. Microcapsules (Akzonobel) were prepared as a solid phase foaming agent in which the average particle diameter of the solid phase foaming agent had been adjusted using a purification system for a solid phase foaming agent. The classification and purification apparatus for a solid phase foaming agent was used as the purification system for a solid phase foaming agent (see FIGS. 3 to 5).

In a casting machine equipped with feeding lines for a urethane-based prepolymer, a curing agent, an inert gas, and a solid phase foaming agent, the urethane-based prepolymer prepared to have an NCO % of 9.1% was charged to the prepolymer tank, triethylenediamine was charged to the curing agent tank, and a solid phase foaming agent was fed in an amount of 2.0 parts by weight based on 100 parts by weight of the raw material mixture, which were stirred at a rotational speed of the mixing head of 3,000 rpm. The mixed mixture was discharged at a rate of 10 kg per minute, injected into a mold in a shape of an opening of 1,000 mm in length and in width and 25 cm in height, and solidified through a thermal curing reaction to obtain a molded body.

Thereafter, the solid material of the molded body was sliced and processed into a sheet form. Thereafter, the surface was cut such that the surface roughness of the polishing pad before polishing was as shown in Table 3 below. The cut sheet was subjected to a grooving process to obtain one sheet (or polishing layer) having a thickness of 2 mm. The finished sheet was laminated with a sub pad using an adhesive to finally obtain a polishing pad.

(3) Polishing Process

The polishing pad was used to carry out a CMP process using the AP-300 model of CTS. The detailed conditions for the CMP process are shown in Table 1 below. Upon completion of the CMP process, the polishing pad was dried. Then, the surface roughness of the polishing pad was measured using the Contour GT model of Bruker. The detailed conditions for measuring the surface roughness are shown in Table 2. The embossed region of the groove was measured at a point of ½ based on the radius of the polishing pad. The measurement was carried out 5 times in total per polishing pad, and an average value was obtained. The volume parameters of surface roughness and the height parameters of surface roughness of the polishing pad after polishing were obtained as shown in Tables 3 and 4, respectively.

Examples 2 to 5

A polishing pad was obtained in the same manner as in Example 1, except that the surface processing conditions of the polishing pad were changed such that the volume parameters of surface roughness and the height parameters of surface roughness of the polishing pad before and after polishing were adjusted as shown in Tables 3 and 4 below.

Comparative Example 1

A polishing pad was obtained in the same manner as in Example 1, except that the rotational speed of the mixing head was adjusted and that the purification process of the solid phase foaming agent by the classification and purification device was not carried out such that the volume parameters of surface roughness and the height parameters of surface roughness of the polishing pad before and after polishing were adjusted as shown in Tables 3 and 4 below.

Comparative Examples 2 and 3

A polishing pad was obtained in the same manner as in Example 1, except that the purification process of the solid phase foaming agent by the classification and purification device was not carried out and that the surface processing conditions of the polishing pad were changed such that the volume parameters of surface roughness and the height parameters of surface roughness of the polishing pad before and after polishing were adjusted as shown in Tables 3 and 4 below.

Table 1 below summarizes the detailed conditions for the CMP process.

TABLE 1

| Catergory | Particulars | Measurement condition |
|---|---|---|
| Wafer | Wafer type | PETEOS |
| | Dummy wafer (polishing time/number of polishing) | 60 sec/25 |
| | Monitoring wafer (polishing time/number of polishing) | 60 sec/2 |
| Pre-break-in | Time (minute) | 15 minutes |
| Carrier | Carried speed (rpm) | 87.0 |
| & | Carrier pressure | 6/3.5/3.5/3.5/3.5/10 |
| platen | (w1/w2/w3/w4/w5/retainer, psi) | |
| | Platen speed (rpm) | 93.0 |
| | Spindle sweep speed (sw/min) | 19.0 |
| Conditioner | Conditioner type | 8031C7 (Saesol) |
| | Conditioning type | In situ |
| | Conditioning force (lb) | 6.0 |
| | Conditioner speed (rpm) | 101.0 |
| | Conditioner sweep speed (sw/min) | 19.0 |
| Slurry | Slurry type | ACS-350 (KC Tech) |
| | Slurry ratio | Slurry: deionized water (DIW) 1:10 |
| | Flow rate (cc/min) | 200 |

Table 2 below summarizes the conditions for measuring the surface roughness of the polishing pad.

TABLE 2

| | Particulars | Measurement condition |
|---|---|---|
| Measurement | Measurement mode | VSI/VXI |
| | Eyepiece | 5 times |
| | Objective lens | 1.5 times |
| Measurement area | X-axis | 1182.6 μm |
| | Y-axis | 893.8 μm |
| Scan option | Speed | x1 |
| | Backscan | 10 μm |
| | Length | 80 μm |
| | Threshold value | 5% |

Tables 3 and 4 below summarize the results of measuring the surface roughness of the polishing pad before and after polishing in the Examples and Comparative Examples.

TABLE 3

| | | Ex. | | | | | C. Ex. | | |
|---|---|---|---|---|---|---|---|---|---|
| | | 1 | 2 | 3 | 4 | 5 | 1 | 2 | 3 |
| Rotational speed of mixing head (rpm) | | 3,000 | 3,000 | 3,000 | 3,000 | 3,000 | 7,000 | 3,000 | 3,000 |
| Avg. diameter of pores (μm) | | 27 | 28 | 26 | 15 | 40 | 24 | 28 | 26 |
| Volume parameters of surface roughness of polishing pad, before polishing | $Vmp(10)/Vv(0)$ | 0.105 | 0.001 | 0.015 | 0.040 | 0.057 | 0.011 | 0.089 | 0.037 |
| | $Vmp(10)Vvv(80)$ | 1.050 | 0.018 | 0.187 | 0.478 | 0.540 | 0.193 | 1.231 | 0.467 |
| | $Vmp(10)/Vmc(10,80)$ | 2.151 | 0.005 | 0.041 | 1.250 | 1.531 | 0.061 | 1.387 | 1.226 |
| | $Vmp(10)/\{Vv(0) + Vvv(80) + Vmc(10,80)\}$ | 3.306 | 0.024 | 0.243 | 1.768 | 2.128 | 0.265 | 2.707 | 1.730 |
| Classification and purification apparatus of a solid phase foaming agent | | Yes | Yes | Yes | Yes | Yes | No | No | No |
| Volume parameters of surface roughness of polishing pad, after polishing | $Vmp(10)$ | 0.296 | 0.312 | 0.275 | 0.230 | 0.489 | 0.315 | 0.261 | 0.425 |
| | $Vv(0)$ | 16.4 | 22.3 | 27.5 | 46.0 | 5.0 | 2.6 | 261.0 | 11.5 |
| | $Vvv(80)$ | 0.811 | 0.975 | 1.375 | 9.580 | 0.498 | 0.311 | 15.353 | 0.731 |
| | $Vmc(10,80)$ | 4.111 | 4.875 | 5.730 | 5.750 | 0.265 | 0.141 | 65.250 | 0.118 |
| | $Vmp(10)/Vv(0)$ | 0.018 | 0.014 | 0.010 | 0.005 | 0.098 | 0.120 | 0.001 | 0.037 |
| | $Vmp(10)Nvv(80)$ | 0.365 | 0.320 | 0.200 | 0.024 | 0.982 | 1.013 | 0.017 | 0.581 |
| | $Vmp(10)/Vmc(10,80)$ | 0.072 | 0.064 | 0.048 | 0.040 | 1.842 | 2.231 | 0.004 | 3.591 |
| | $Vmp(10)/\{Vv(0) + Vvv(80) + Vmc(10,80)\}$ | 0.455 | 0.398 | 0.258 | 0.069 | 2.922 | 3.364 | 0.022 | 4.209 |

TABLE 4

| | | Ex. | | | | | C. Ex. | | |
|---|---|---|---|---|---|---|---|---|---|
| | | 1 | 2 | 3 | 4 | 5 | 1 | 2 | 3 |
| Rotational speed of mixing head (rpm) | | 3,000 | 3,000 | 3,000 | 3,000 | 3,000 | 7,000 | 3,000 | 3,000 |
| Avg. diameter of pores (μm) | | 27 | 28 | 26 | 15 | 40 | 24 | 28 | 26 |
| Height parameters of surface roughness of polishing pad, before polishing | Spk/Sk | 0.9 | 0.1 | 0.3 | 0.4 | 0.6 | 0.4 | 0.8 | 0.5 |
| | Svk/Sk | 2.2 | 0.15 | 0.8 | 1 | 1.5 | 0.9 | 1.9 | 1.3 |
| | Spk/Svk | 1.2 | 0.15 | 0.2 | 0.4 | 0.9 | 0.2 | 1.1 | 0.6 |
| | (Spk + Svk)/Sk | 3.1 | 0.25 | 1.1 | 1.5 | 1.5 | 1.3 | 2.7 | 1.8 |
| | Spk/Sk + Svk/Sk + Spk/Svk | 4.3 | 0.4 | 1.3 | 1.8 | 3.0 | 1.5 | 3.8 | 2.4 |
| Classification and purification apparatus of a solid phase foaming agent | | Yes | Yes | Yes | Yes | Yes | No | No | No |
| Height parameters of surface roughness of polishing pad, after polishing | Spk | 5.4 | 5.8 | 5.0 | 2.6 | 9.1 | 5.5 | 4.9 | 5.1 |
| | Sk | 6.0 | 8.3 | 12.5 | 26.0 | 8.3 | 55.0 | 4.1 | 2.6 |
| | Svk | 12.0 | 13.3 | 11.3 | 13.0 | 19.9 | 11.0 | 10.7 | 6.4 |
| | Spk/Sk | 0.9 | 0.7 | 0.4 | 0.1 | 1.1 | 0.1 | 1.2 | 2.0 |
| | Svk/Sk | 2.0 | 1.6 | 0.9 | 0.5 | 2.4 | 0.2 | 2.6 | 2.0 |
| | Spk/Svk | 0.7 | 0.5 | 0.3 | 0.2 | 1.1 | 0.1 | 1.2 | 0.8 |
| | (Spk + Svk)/Sk | 2.9 | 2.3 | 1.3 | 0.5 | 3.5 | 0.3 | 3.6 | 4.0 |
| | Spk/Sk + Svk/Sk + Spk/Svk | 3.6 | 2.8 | 1.6 | 0.8 | 4.6 | 0.4 | 4.8 | 4.8 |

Test Example 1

Polishing Rate (Removal Rate)

The initial polishing rate immediately after the polishing pad had been prepared was measured as follows.

A silicon wafer having a diameter of 300 mm was deposited with silicon oxide by a chemical vapor deposition (CVD) process. The polishing pad was mounted on a CMP machine, and the silicon wafer was set with the silicon oxide layer thereof facing the polishing surface of the polishing pad. Thereafter, the silicon oxide layer was polished under a polishing load of 4.0 psi while the silicon wafer was rotated at a speed of 150 rpm, the platen was rotated at a speed of 150 rpm for 60 seconds, and a calcined ceria slurry was supplied on the polishing pad at a rate of 250 ml/min. Upon completion of the polishing, the silicon wafer was detached from the carrier, mounted in a spin dryer, washed with deionized water (DIW), and then dried with nitrogen ($N_2$) for 15 seconds. The film thickness of the dried silicon wafer was measured before and after the polishing using a spectral reflectometer type thickness measuring instrument (Manufacturer: Keyence, Model: SI-F80R). The polishing rate was calculated using the following Equation 12.

Polishing rate (Å/min)=polished thickness of a silicon wafer (Å)/polishing time (minute)  [Equation 12]

Test Example 2

Measurement of Residues, Scratches, and Chatter Marks

After the polishing process was carried out using the polishing pad of the Examples and the Comparative Examples, the residues, scratches, and chatter marks appearing on the surface of the wafer (i.e., monitoring wafer) upon the polishing was measured using wafer inspection equipment (AIT XP+, KLA Tencor) (threshold: 150, die filter threshold: 280).

The residue means a substantially amorphous foreign matter that adheres to the wafer surface. For example, it means a defect of the shape as shown in FIG. 6.

The scratch means a substantially continuous linear scratch. For example, it means a defect of the shape as shown in FIG. 7.

Meanwhile, the chatter mark means a substantially discontinuous linear scratch. For example, it means a defect of the shape as shown in FIG. 8.

The results are shown in Table 5 below.

TABLE 5

|  | Ex. | | | | | C. Ex. | | |
| --- | --- | --- | --- | --- | --- | --- | --- | --- |
|  | 1 | 2 | 3 | 4 | 5 | 1 | 2 | 3 |
| Polishing rate (Å/min) | 2,998 | 2,919 | 2,945 | 3,257 | 2,615 | 2,081 | 4,153 | 2,394 |
| Residue (count) | 73 | 62 | 86 | 100 | 81 | 217 | 256 | 209 |
| Scratch (count) | 141 | 125 | 159 | 161 | 146 | 789 | 575 | 710 |
| Chatter mark (count) | 2.5 | 2.0 | 3.5 | 3.0 | 2.5 | 18.5 | 13.5 | 16.0 |

As can be seen from Table 5, the polishing pads of Examples 1 to 5 in which the height parameters of surface roughness and the volume parameters of surface roughness of the polishing pad after polishing were adjusted within specific ranges had excellent polishing rates. The number of residues, surface scratches, and chatter marks appearing on the wafer surface was significantly lower than that in the case where the polishing pads of Comparative Examples 1 to 3 were used.

Specifically, the polishing rates of 2,919 Å/min and 2,998 Å/min in Examples 1 to 3 were overall excellent. In contrast, the polishing rate of the polishing pad in Comparative Example 2 was 3,715 Å/min in which the initial polishing rate was excessively high due to an increase in the ratio of the friction area to the pores capable of carrying the slurry. Thus, the polishing pad of Comparative Example 2 is expected to further increase in the polishing rate due to the pad glazing phenomenon. On the other hand, the polishing rate of the polishing pad in Comparative Example 1 was 2,081 Å/min, which was significantly low.

Meanwhile, in the polishing pads in Examples 4 and 5, while the polishing rate was slightly decreased or slightly increased as compared with the polishing pads of Examples 1 to 3, the number of residues, surface scratches, and chatter marks on the wafer surface was similar to that in the case where the polishing pads of Examples 1 to 3 were used and significantly reduced as compared with the case where the polishing pads of Comparative Examples 1 to 3 were used.

Specifically, in terms of residues appearing on the wafer surface, the number of residues was 62 to 100 in the case of the polishing pads of Examples 1 to 5, whereas the number of residues exceeded 200 in the case of the polishing pads of Comparative Examples 1 to 3, which was significantly increased by twice or more as compared with the case where the polishing pads of Examples 1 to 5 were used.

In addition, in terms of scratches, the number of scratches was 125 to 161 in the case of the polishing pads of Examples 1 to 5, whereas the number of scratches was 575 or more in the case of the polishing pads of Comparative Examples 1 to 3, which was significantly increased by three times or more as compared with the case where the polishing pads of Examples 1 to 5 were used.

In addition, in terms of chatter marks, the number of chatter marks was 3.5 or lower in the case of the polishing pads of Examples 1 to 5, whereas the number of chatter marks exceeded 13 in the case of the polishing pads of Comparative Examples 1 to 3, which was significantly increased by four times or more as compared with the case where the polishing pads of Examples 1 to 5 were used.

Accordingly, it was confirmed that maintaining surface roughness to be constant during or after polishing, rather than the surface roughness before polishing, is advantageous for maintaining a constant polishing performance.

The invention claimed is:

1. A polishing pad, which satisfies the following Relationships 5 and 6 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$Spk/Svk < 1.2$  [Relationship 5]

$0.1 \leq Spk/Sk \leq 1.1$  [Relationship 6]

in Relationships 5 and 6, Spk is the reduced peak height, Svk is the reduced valley depth, and Sk is the core roughness depth.

2. The polishing pad of claim 1, wherein a pre-break-in process is carried out for 10 to 20 minutes before the dummy wafers are polished to condition the polishing layer of the polishing pad.

3. The polishing pad of claim 1, which satisfies at least one selected from an Spk of 2 to 10, an Svk of greater than 11 to 22, and an Sk of 5 to 40.

4. The polishing pad of claim 1, wherein the polishing pad after the polishing satisfies at least one selected from the following Relationships 7 to 10:

$$0.2 < Svk/Sk \leq 2.5 \quad \text{[Relationship 7]}$$

$$0.3 < Spk/Svk + Svk/Sk \leq 3.6 \quad \text{[Relationship 8]}$$

$$0.3 < Spk/Sk + Svk/Sk \leq 3.6 \quad \text{[Relationship 9]}$$

$$0.45 \leq Spk/Sk + Svk/Sk + Spk/Svk \leq 4.7 \quad \text{[Relationship 10]}$$

in Relationships 7 to 10, Spk, Svk, and Sk are as defined in claim 1.

5. The polishing pad of claim 1, wherein the absolute value of the difference in Svk/Sk between before and after the polishing of the polishing pad is 0.1 to 1.5, and the absolute value of the difference in Spk/Sk between before and after the polishing of the polishing pad is 0 to 0.6.

6. The polishing pad of claim 1, which comprises a plurality of pores having an average diameter of 5 μm to 200 μm,
wherein the polishing pad satisfies at least one selected from the characteristics of:
a polishing rate of 2,600 Å/min to 3,300 Å/min for an oxide layer;
100 or less of the number of surface residues on the monitoring wafer;
200 or less of the number of surface scratches on the monitoring wafer; and
5 or less of the number of chatter marks on the monitoring wafer.

7. The polishing pad of claim 1, which comprises a polishing layer comprising a cured product formed from a composition comprising a urethane-based prepolymer, a curing agent, and a foaming agent, and
wherein the foaming agent comprises a solid phase foaming agent, a gas phase foaming agent, or a mixed foaming agent thereof.

8. The polishing pad of claim 7, wherein the solid phase foaming agent is purified by a purification system for a solid phase foaming agent.

9. The polishing pad of claim 8, the purified solid phase foaming agent has an average particle diameter (D50) of 5 μm to 200 μm.

10. A process for preparing a polishing pad, which comprises:
mixing a urethane-based prepolymer, a curing agent, and a foaming agent to prepare a raw material mixture; and
injecting the raw material mixture into a mold and curing it to obtain a polishing pad,
wherein the polishing pad satisfies the following Relationships 5 and 6 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$Spk/Svk < 1.2 \quad \text{[Relationship 5]}$$

$$0.1 \leq Spk/Sk \leq 1.1 \quad \text{[Relationship 6]}$$

in Relationships 5 and 6, Spk is the reduced peak height, Svk is the reduced valley depth, and Sk is the core roughness depth.

11. A polishing pad, which satisfies the following Relationship 11 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$0.5 \leq (Spk + Svk)/Sk \leq 3.5 \quad \text{[Relationship 11]}$$

in Relationship 11, Spk is the reduced peak height, Svk is the reduced valley depth, and Sk is the core roughness depth.

12. The polishing pad of claim 11, wherein a pre-break-in process is carried out for 10 to 20 minutes before the dummy wafers are polished to condition the polishing layer of the polishing pad.

13. The polishing pad of claim 11, which satisfies at least one selected from an Spk of 2 to 10, an Svk of greater than 11 to 22, an Sk of 5 to 40, and a total sum of Spk and Svk being greater than 13 to 32.

14. The polishing pad of claim 11, wherein the polishing pad after the polishing satisfies at least one selected from the following Relationships 5 to 10:

$$Spk/Svk < 1.2 \quad \text{[Relationship 5]}$$

$$0.1 \leq Spk/Sk \leq 1.1 \quad \text{[Relationship 6]}$$

$$0.2 < Svk/Sk \leq 2.5 \quad \text{[Relationship 7]}$$

$$0.3 < Spk/Svk + Svk/Sk \leq 3.6 \quad \text{[Relationship 8]}$$

$$0.3 < Spk/Sk + Svk/Sk \leq 3.6 \quad \text{[Relationship 9]}$$

$$0.45 \leq Spk/Sk + Svk/Sk + Spk/Svk \leq 4.7 \quad \text{[Relationship 10]}$$

in Relationships 5 to 10, Spk, Svk, and Sk are as defined in claim 11.

15. The polishing pad of claim 14, wherein the absolute value of the difference in Svk/Sk between before and after the polishing of the polishing pad is 0.1 to 1.5, and the absolute value of the difference in Spk/Sk between before and after the polishing of the polishing pad is 0 to 0.6.

16. The polishing pad of claim 11, which comprises a plurality of pores having an average diameter of 5 μm to 200 μm,
wherein the polishing pad satisfies at least one selected from the characteristics of:
a polishing rate of 2,600 Å/min to 3,300 Å/min for an oxide layer;
100 or less of the number of surface residues on the monitoring wafer;
200 or less of the number of surface scratches on the monitoring wafer; and
5 or less of the number of chatter marks on the monitoring wafer.

17. A process for preparing a polishing pad, which comprises:
mixing a urethane-based prepolymer, a curing agent, and a foaming agent to prepare a raw material mixture; and
injecting the raw material mixture into a mold and curing it to obtain a polishing pad,
wherein the polishing pad satisfies the following Relationship 11 in the areal material ratio curve based on the ISO 25178-2 standard after 25 dummy wafers are polished for 60 seconds each and two monitoring wafers are polished for 60 seconds each, each of the wafers being a silicon oxide wafer (or PETEOS wafer), while a calcined ceria slurry is sprayed at a rate of 200 cc/min on to the polishing pad, and when the polishing pad after the polishing is measured with an optical surface roughness meter:

$$0.5 \leq (Spk+Svk)/Sk \leq 3.5 \qquad \text{[Relationship 11]}$$

in Relationship 11, Spk is the reduced peak height, Svk is the reduced valley depth, and Sk is the core roughness depth.

18. The process for preparing a polishing pad of claim 17, wherein the foaming agent comprises a solid phase foaming agent, a gas phase foaming agent, or a mixed foaming agent thereof, and the solid phase foaming agent is purified by a purification system for a solid phase foaming agent.

19. The process for preparing a polishing pad of claim 17, wherein the mixing is carried out using a mixing head at a speed of 500 rpm to 10,000 rpm.

20. The process for preparing a polishing pad of claim 18, wherein the purified solid phase foaming agent has an average particle diameter (D50) of 5 μm to 200 μm.

* * * * *